(12) United States Patent
Nakao

(10) Patent No.: US 7,781,065 B2
(45) Date of Patent: *Aug. 24, 2010

(54) MULTILAYER CERAMIC SUBSTRATE, METHOD FOR MAKING THE SAME, AND COMPOSITE GREEN SHEET FOR MAKING MULTILAYER CERAMIC SUBSTRATE

(75) Inventor: Shuya Nakao, Higashiomi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 161 days.

This patent is subject to a terminal disclaimer.

(21) Appl. No.: 11/691,867

(22) Filed: Mar. 27, 2007

(65) Prior Publication Data

US 2007/0205692 A1 Sep. 6, 2007

Related U.S. Application Data

(63) Continuation of application No. PCT/JP2006/312301, filed on Jun. 20, 2006.

(30) Foreign Application Priority Data

Jul. 1, 2005 (JP) .............................. 2005-194148
Apr. 28, 2006 (JP) .............................. 2006-124764

(51) Int. Cl.
*B32B 17/06* (2006.01)
*B32B 15/00* (2006.01)
*B32B 9/00* (2006.01)
*B32B 19/00* (2006.01)

(52) U.S. Cl. ....................... 428/426; 428/432; 428/701; 428/702

(58) Field of Classification Search ... 156/89.11–89.28; 428/426, 432, 701, 702

See application file for complete search history.

(56) References Cited

U.S. PATENT DOCUMENTS 5,085,720 A 2/1992 Mikeska et al.

(Continued)

FOREIGN PATENT DOCUMENTS

JP 2554415 B2 11/1996

(Continued)

OTHER PUBLICATIONS

Official Communication for PCT Application No. PCT/JP2006/312301; mailed on Sep. 12, 2006.

(Continued)

*Primary Examiner*—Timothy M Speer
*Assistant Examiner*—Jonathan C Langman
(74) *Attorney, Agent, or Firm*—Keating & Bennett, LLP

(57) ABSTRACT

A multilayer ceramic substrate includes a base material layer including an aggregate of first particles containing a crystallized glass material and a first ceramic material, a constraining layer including an aggregate of second particles containing a second ceramic material that does not sinter at a temperature at which the crystallized glass material is melted, an intercalating layer including an aggregate of third particles containing a viscosity-decreasing substance that decreases the viscosity the melted crystallized glass material, and conductive films arranged along a main surface of at least one of the base material layer, the constraining layer, and the intercalated layer. The multilayer ceramic substrate also includes conductive films provided along a main surface of at least one of the base material layer, the constraining layer, and the intercalated layer.

11 Claims, 10 Drawing Sheets

U.S. PATENT DOCUMENTS

| | | | |
|---|---|---|---|
| 5,254,191 A | 10/1993 | Mikeska et al. | |
| 5,387,474 A | 2/1995 | Mikeska et al. | |
| 5,474,741 A | 12/1995 | Mikeska et al. | |
| 6,036,798 A * | 3/2000 | Nishide et al. | 156/89.12 |
| 6,432,239 B1 | 8/2002 | Mandai et al. | |
| 6,468,640 B2 * | 10/2002 | Nishide et al. | 428/210 |
| 6,517,924 B1 | 2/2003 | Kameda et al. | |
| 6,588,097 B2 | 7/2003 | Nishide et al. | |
| 6,743,534 B2 | 6/2004 | Lautzenhiser et al. | |
| 2002/0061629 A1 | 5/2002 | Nishide et al. | |
| 2002/0157760 A1 | 10/2002 | Mandai et al. | |
| 2003/0168150 A1 * | 9/2003 | Lee et al. | 156/89.12 |
| 2003/0211302 A1 | 11/2003 | Mandai et al. | |

FOREIGN PATENT DOCUMENTS

| | | |
|---|---|---|
| JP | 2617643 B2 | 6/1997 |
| JP | 2000-315864 A | 11/2000 |
| JP | 2000-025157 A | 1/2001 |
| JP | 2002-094244 A | 3/2002 |
| JP | 2002-160980 A | 6/2002 |
| JP | 2002-198647 A | 7/2002 |
| JP | 2004-200679 A | 7/2004 |
| JP | 3601671 B2 | 12/2004 |

OTHER PUBLICATIONS

Official communication issued in counterpart Chinese Application No. 200680001047.3, mailed on Sep. 19, 2008.

Nakao; "Multilayer Ceramic Substrate, Method for Making the Same, and Composite Green Sheet for Making Multilayer Ceramic Substrate"; U.S. Appl. No. 11/765,517, filed Jun. 20, 2007.

* cited by examiner

US 7,781,065 B2

MULTILAYER CERAMIC SUBSTRATE, METHOD FOR MAKING THE SAME, AND COMPOSITE GREEN SHEET FOR MAKING MULTILAYER CERAMIC SUBSTRATE

BACKGROUND OF THE INVENTION

1. Field of the Invention

The present invention relates to multilayer ceramic substrates, methods for making the same, and composite green sheets for making multilayer ceramic substrates, and in particular, to a multilayer ceramic substrate produced by the application of a zero shrinkage process, a method for making the same, and a composite green sheet for making a multilayer ceramic substrate.

2. Description of the Related Art

An example of a multilayer ceramic substrate related to the present invention is described in Japanese Unexamined Patent Application Publication No. 2000-25157 (Patent Document 1). Patent document 1 discloses a composite laminate and a production method therefor using a zero shrinkage process. In particular, patent document 1 discloses a composite laminate that can be produced while inhibiting shrinkage caused by baking and that can be used in an as-baked state, and a production method therefor. As a preferable example, a multilayer ceramic substrate having a structure described below and a production method therefor are disclosed in patent document 1.

That is, the multilayer ceramic substrate includes a base material layer including an aggregate of first particles containing a glass material and a first ceramic material, and a constraining layer including an aggregate of second particles containing a second ceramic material that does not sinter at a temperature at which the glass material melts. At least a portion of the first particles is in a sintered state. In contrast, the second particles are in an unsintered state but are bonded to each other since a portion of the first particles containing the glass material diffuses or flows into the constraining layer.

In order to prepare such a multilayer ceramic substrate, a green laminate including a base material layer in a green state containing the first particles and a constraining layer in a green state containing the second particles is prepared, and then the green laminate is baked. During the baking step, at least a portion of the first particles is sintered. Furthermore, in the baking step, a portion of the first particles, typically a portion of the glass material contained in the first particles, diffuses or flows into the constraining layer. As a result, although the second particles do not sinter, the second particles are bonded to each other via the portion of the first particles, in particular, via the glass material.

According to the production method described above, the second particles do not sinter during the baking step. Thus, the constraining layer containing the second particles inhibits shrinkage of the base material layer, and shrinkage of the multilayer ceramic substrate caused by baking is inhibited as a whole. As a result, dimensional variations among the resulting multilayer ceramic substrates are reduced. Moreover, there is no need to subsequently remove the constraining layer from the resulting multilayer ceramic substrate since the second particles contained in the constraining layer are bonded to each other while a portion of the first particles containing the glass material diffuses or flows into the constraining layer.

However, when the technique described in Patent Document 1 described above is used, there is a problem in that, depending on the type of the glass material contained in the base material layer, the glass material does not sufficiently permeate into the constraining layer. The main cause of this problem is presumably the high viscosity and low flowability of the glass material during melting.

A first conceivable solution to this problem is to use a glass material having low viscosity in the base material layer. However, when a glass material having low viscosity is used and, for example, formation of a capacitance in the base material layer is attempted, there is a problem in that necessary capacitance cannot be obtained due to excessively low relative dielectric constant of the base material layer. In other words, selecting a glass material having low viscosity and satisfying the required electrical characteristics or adjusting the composition of the glass material is technically difficult.

Another conceivable approach for solving the above-described problem of the glass material not sufficiently permeating into the constraining layer is to reduce the thickness of the constraining layer. However, when the thickness of the constraining layer is reduced, the shrinkage-inhibiting effect of the constraining layer is reduced. As a result, a problem of warpage in the resulting multilayer ceramic substrate occurs.

In particular, when the glass material contained in the base material layer is a crystallized glass material, this problem is more serious since the crystallized glass inherently has high viscosity.

SUMMARY OF THE INVENTION

Preferred embodiments of the present invention provide a multilayer ceramic substrate, a production method therefor, and a composite green sheet for multilayer ceramic substrate production that overcome the above-described problems.

A multilayer ceramic substrate according to a preferred embodiment of the present invention includes a base material layer including an aggregate of first particles containing a crystallized glass material and a first ceramic material, a constraining layer including an aggregate of second particles containing a second ceramic material that does not sinter at a temperature at which the crystallized glass material is melted, an intercalating layer including an aggregate of third particles containing a viscosity-decreasing substance that decreases the viscosity the melted crystallized glass material, and conductive films provided along a main surface of at least one of the base material layer, the constraining layer, and the intercalated layer. The multilayer ceramic substrate further includes conductive films provided along a main surface of at least one of the base material layer, the constraining layer, and the intercalated layer.

The intercalated layer includes one main surface in contact with the base material layer and the other main surface in contact with the constraining layer. At least a portion of the first particles is in a sintered state. In contrast, the second particles are in an unsintered state but are bonded to each other since a portion of the first particles containing the glass material and a portion of the third particles diffuse or flow into the constraining layer.

Preferably, the viscosity-decreasing substance contains at least one of a low-viscosity glass material and a low-melting-temperature glass material.

Preferably, a portion of the crystallized glass material contained in the base material layer diffuses or flows into all portions of the constraining layer and all of the second particles are bonded to each other by the portion of the crystallized glass material.

The crystallized glass material contained in the base material layer may contain a material vitrified prior to the baking step of sintering at least a portion of the first particles or a material vitrified by melting during the baking step of sintering at least a portion of the first particles.

The multilayer ceramic substrate may include a plurality of base material layers, and a laminated structure portion may be provided between the base material layers that are adjacent to one another in the lamination direction. The laminated structure portion includes the intercalated layer, the constraining layer, and another intercalated layer laminated in that order. When there are a plurality of base material layers, the crystallized glass material content per unit volume in each of the base material layers adjacent in the lamination direction with the intercalated layer, the constraining layer, and the intercalated layer therebetween is preferably substantially the same.

In the multilayer ceramic substrate according to preferred embodiments of the present invention, the constraining layer is preferably thinner than the base material layer.

Preferred embodiments of the present invention are advantageously applied to a multilayer ceramic substrate further including a cavity having an opening arranged along at least one main surface.

In this multilayer ceramic substrate according to preferred embodiments of the present invention, a difference between a thermal expansion coefficient of the base material layer and a thermal expansion coefficient of the intercalated layer is preferably about 2.0 ppm/° C. or less in terms of absolute values, and a difference between a thermal expansion coefficient of the constraining layer and a thermal expansion coefficient of the intercalated layer is preferably about 2.0 ppm/° C. or less in terms of absolute values.

A method for making the multilayer ceramic substrate according to another preferred embodiment of the present invention includes a laminate preparation step and a baking step.

In the laminate preparation step, a green laminate is prepared which includes a base material layer in a green state containing first particles that include a crystallized glass material or a glass component capable of forming a crystallized glass material by vitrification by melting during baking and a first ceramic material, a constraining layer in a green state containing second particles that include a second ceramic material that does not sinter at a temperature at which the crystallized glass material is melted, an intercalating layer in a green state containing third particles that include a viscosity-decreasing substance that decreases the viscosity of the melted crystallized glass material, and conductive films provided along one main surface of at least one of the base material layer, the constraining layer, and the intercalating layer, the intercalating layer having a first main surface in contact with the base material layer and a second main surface in contact with the constraining layer.

In the baking step, the green laminate is baked at a predetermined temperature to sinter at least a portion of the first particles and to allow a portion of the first particles containing the crystallized glass material and a portion of the third particles to diffuse or flow into the constraining layer so that the second particles are bonded to each other without sintering.

If the viscosity-decreasing substance includes at least one of a low-viscosity glass material and a low-melting-point glass material, the viscosity of the melt of the crystallized glass material is decreased during the baking step as the at least one of the low-viscosity glass material and the low-melting-point glass material mixes with the crystallized glass material.

In the baking step, a portion of the crystallized glass material contained in the base material layer preferably diffuses or flows into all portions of the constraining layer such that all of the second particles are bonded to each other.

When the base material layer in a green state includes a glass component capable of forming a crystallized glass material by vitrification by melting during baking, the glass component is melted and vitrified during the baking step.

When the green laminate includes a plurality of base material layers and the intercalated layer, the constraining layer and another intercalated layer are laminated in that order between the base material layers adjacent in the lamination direction, it is preferable to adjust the thickness of each base material layer so that the crystallized glass material content per unit volume in each of the base material layers adjacent in the lamination direction with the intercalated layer, the constraining layer, and the intercalated layer therebetween is substantially the same.

When the green laminate includes via hole conductors electrically connected to the conductor films and penetrating a particular base material layer in the thickness direction, the green laminate preferably further contains shrinkage-inhibiting layers provided on both main surfaces of the green laminate and having substantially the same composition as that of the constraining layer. In such a case, a step of removing the shrinkage-inhibiting layers which remain unsintered is performed after the baking step.

When the via hole conductors include via hole conductors provided on the base material layer arranged at the outermost side of the green laminate in the lamination direction, the above-described preferred embodiment that includes the shrinkage-inhibiting layers is advantageously used.

In the green laminate, the base material layer is preferably in contact with the shrinkage-inhibiting layer.

In the method for making a multilayer ceramic substrate according to preferred embodiments of the present invention, after the baking step, a difference between a thermal expansion coefficient of the base material layer and a thermal expansion coefficient of the intercalated layer is preferably about 2.0 ppm/° C. or less in terms of absolute values, and a difference between a thermal expansion coefficient of the constraining layer and a thermal expansion coefficient of the intercalated layer is preferably about 2.0 ppm/° C. or less in terms of absolute values.

Another preferred embodiment of the present invention is directed to a composite green sheet for making a multilayer ceramic substrate that is used in the above-described method for making the multilayer ceramic substrate.

According to a preferred embodiment, the composite green sheet for making a multilayer ceramic substrate of the present invention includes a base material layer in a green state containing particles that include a crystallized glass material or a glass component capable of forming a crystallized glass material by vitrification by melting during baking and a ceramic material, and an intercalating layer in a green state being provided on the base material layer and containing particles that include a viscosity-decreasing substance that decreases the viscosity of a melt of the crystallized glass material.

According to another preferred embodiment, the composite green sheet for making a multilayer ceramic substrate of the present invention includes a base material layer in a green state containing particles that include a crystallized glass material or a glass component capable of forming a crystallized glass material by vitrification by melting during baking and a first ceramic material, a constraining layer in a green state containing second particles that include a second ceramic material that does not sinter at a temperature at which the crystallized glass material are melted, and an intercalating layer in a green state containing third particles that include a viscosity-decreasing substance that decreases the viscosity of a melt of the crystallized glass material, the intercalating layer having one of main surfaces in contact with the base material layer and the other main surface in contact with the constraining layer.

According to another preferred embodiment, the composite green sheet for making a multilayer ceramic substrate of the present invention includes base material layers in a green state containing first particles that include a crystallized glass material or a glass component capable of forming a crystallized glass material by vitrification by melting during baking and a first ceramic material, a constraining layer in a green state containing second particles that include a second ceramic material that does not sinter at a temperature at which the crystallized glass material is melted, and intercalating layers in a green state containing third particles that include a viscosity-decreasing substance that decreases the viscosity of a melt of the crystallized glass material, wherein a first one of the base material layers, a first one of the intercalating layers, the constraining layer, a second one of the intercalating layers, and a second one of the base material layers are laminated in that order.

According to preferred embodiments of the present invention, since the intercalating layer is disposed between the base material layer and the constraining layer, the crystallized glass material contained in the base material layer can contact the viscosity-decreasing substance contained in the intercalating layer. Thus, in the baking step, the viscosity of the crystallized glass material contained in the base material layer is decreased as a portion of the viscosity-decreasing substance contained in the intercalating layer is eluted to the base material layer or mixes with the crystallized glass material contained in the base material layer. As a result, the crystallized glass material contained in the base material layer can be more smoothly penetrated into the constraining layer through the intercalating layer.

Accordingly, the crystallized glass material sufficiently permeates into the constraining layer without relying upon other configurations, such as thinning the constraining layer, and the constraining force provided by the constraining layer during baking is sufficient. Moreover, there is no need to rely on other configurations, such as increasing the baking temperature in order to decrease the viscosity of the crystallized glass material. Thus, the baking temperature can be relatively low. As a result, the resulting multilayer ceramic substrate is not subjected to substantial deformation, such as warpage. Furthermore, since there is no need to use a low-viscosity material as the crystallized glass material contained in the base material layer at the risk of compromising electrical properties, the multilayer ceramic substrate maintains satisfactory electrical properties and the breadth of choice of crystallized glass material contained in the base material layer is expanded.

According to preferred embodiments of the present invention, as in the case of the invention described in patent document 1, the second particles that contain the second ceramic material are not sintered. Thus, the constraining layer containing the second particles inhibits shrinkage of the base material layer, and as a result, the shrinkage of the multilayer ceramic substrate as a whole during baking is prevented. As a result, in the multilayer ceramic substrate, undesirable deformation is prevented and dimensional variations are decreased. Although the second particles contained in the constraining layer are in an unsintered state, the second particles are bonded to each other as a portion of the first particles containing the crystallized glass material and a portion of the third particles diffuse or flow into the constraining layer. Thus, there is no need to remove the constraining layer afterwards, and the substrate can be used as is.

The dimensional variations described above are likely to occur in a multilayer ceramic substrate having a cavity. Thus, the present invention can be more advantageously applied to a multilayer ceramic substrate having a cavity and a production method therefor. When preferred embodiments of the present invention are applied to the multilayer ceramic substrate having the cavity, deformation of the cavity portion is also reduced.

In preferred embodiments of the present invention, when a portion of the crystallized glass material contained in the base material layer diffuses or flows into all portions of the constraining layer and all of the second particles are bonded to each other by this portion of the crystallized glass material, the mechanical strength of the multilayer ceramic substrate is increased.

When a laminated structure portion is provided between the base material layers adjacent in the lamination direction, the laminated structure portion including the intercalated layer, the constraining layer, and another intercalated layer laminated in that order, and when the thickness of each base material layer is set such that the crystallized glass material content per unit volume in each of the base material layers adjacent in the lamination direction is substantially the same, the amounts of crystallized glass material permeating from each of the base material layers adjacent in the lamination direction into the constraining layer located between the base material layers achieve a good balance. Thus, in the baking step, the amount of shrinkage of each base material layer is substantially the same. Therefore, warpage in the resulting multilayer ceramic substrate is more securely prevented.

When the constraining layer is thinner than the base material layer, the crystallized glass material contained in the base material can more easily diffuse or flow into all portions of the constraining layer.

In the method for making the multilayer ceramic substrate according to preferred embodiment of the present invention, when the green laminate includes via hole conductors and shrinkage-inhibiting layers provided on both main surfaces of the green laminate, warpage of the multilayer ceramic substrate that would occur during the baking step is suppressed. As the thickness the shrinkage-inhibiting layers increases, the warpage is more effectively prevented.

Moreover, in preferred embodiments of the present invention, in the baking step, the shrinkage in the main surface direction of the multilayer ceramic substrate is prevented. Thus, a larger degree of shrinkage occurs in the lamination direction. On the other hand, since the via hole conductors are primarily composed of a conductive component, the shrinkage ratio during the baking step is relatively low. Thus, there would be a problem in that projections resulting from the presence of the via hole conductors would be undesirably formed in the multilayer ceramic substrate after the baking step. The shrinkage-inhibiting layers described above also inhibit projections caused by the via hole conductors.

When the via hole conductor is provided in the base-material layer located at the outermost side in the lamination direction of the green laminate, projections are more likely to occur. Thus, the effect of the shrinkage-inhibiting layers is particularly emphasized in this case.

Moreover, in the green laminate, when no intercalating layer is provided between the base material layer and the shrinkage inhibiting layer and the base material layer is in contact with the shrinkage inhibiting layer, it is more difficult to diffuse the crystallized glass material or allow the crystallized glass material to flow into the shrinkage-inhibiting layers. Thus, the shrinkage-inhibiting layers can be easily removed after the baking step, and conductor films can be provided on a main surface of the base material layer facing outward without difficulties.

In preferred embodiments of this invention, when the difference between the thermal expansion coefficient of the base material layer and the thermal expansion coefficient of the intercalated layer is about 2.0 ppm/° C. or less in terms of absolute values and when the difference between the thermal expansion coefficient of the constraining layer and the thermal expansion coefficient of the intercalated layer is about 2.0 ppm/° C. or less in terms of absolute values, the remaining stresses in the cooling step after the baking step are reduced, for example. Thus, the possibility of generating structural defects such as cracks by these stresses is reduced, and the reliability of the multilayer ceramic substrate is improved.

According to the composite green sheet for making the multilayer ceramic substrate of preferred embodiments of the present invention, it is possible to efficiently make a green laminate prepared for the production of the multilayer ceramic substrate.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 19A-19C show samples of a multilayer ceramic substrate obtained by dicing the mother substrate shown in FIG. 18, in which FIG. 19A is a cross-sectional view taken along line A-A in FIG. 19B or 19C; FIG. 19B is a cross-sectional view taken along line B-B in FIG. 19A; and FIG. 19C is a cross-sectional view taken along line C-C in FIG. 19A.

DETAILED DESCRIPTION OF PREFERRED EMBODIMENTS

Figure 1:
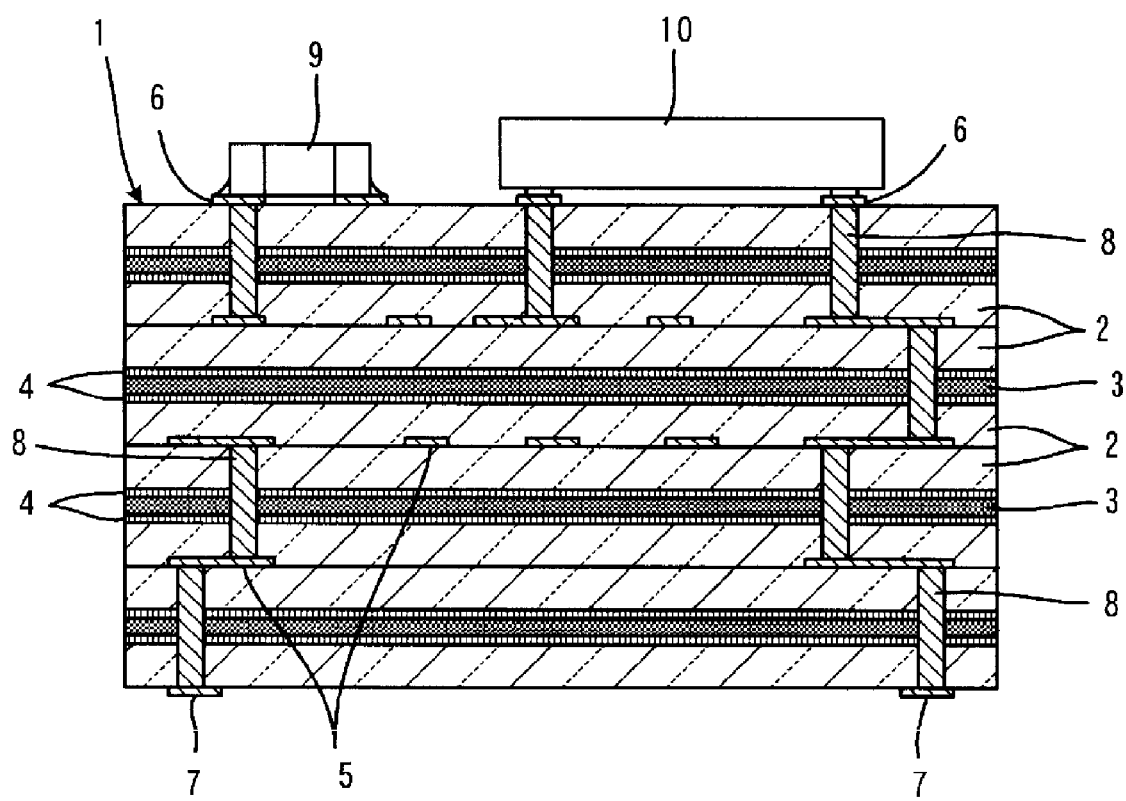
FIG. 1 is a cross-sectional view illustrating a multilayer ceramic substrate according to a first preferred embodiment of the present invention.

FIG. 1 is a cross-sectional view illustrating a multilayer ceramic substrate 1 according to a first preferred embodiment of the present invention. In FIG. 1, the multilayer ceramic substrate 1 is illustrated by magnifying the dimensions in the thickness direction.

The multilayer ceramic substrate 1 has a multilayer structure including a plurality of base material layers 2, a plurality of constraining layers 3, and a plurality of intercalated layers 4. In this preferred embodiment, a laminated structure section in which an intercalated layer 4, a constraining layer 3, and another intercalated layer 4 are laminated in that order between two base material layers 2 adjacent in the lamination direction is provided. Moreover, in this preferred embodiment, a laminated structure section in which an intercalated layer 4, two base material layers 2, and another intercalated layer 4 are laminated in that order between the two constraining layers 3 adjacent in the lamination direction is provided. Although the two base material layers 2 are illustrated as being in contact with each other in this preferred embodiment, this is to simplify the explanation of the production method described below. In actuality, the adjacent two base material layers 2 are integral.

The base material layer 2 includes an aggregate of first particles containing a crystallized glass material and a first ceramic material. For example, a $SiO_2$—$CaO$—$Al_2O_3$—$B_2O_3$-based material is used as the crystallized glass material, for example, and alumina is used as the first ceramic material.

The constraining layer 3 includes an aggregate of second particles containing a second ceramic material that does not sinter at a temperature at which the crystallized glass material is melted. For example, alumina is advantageously used as the second ceramic material.

The intercalated layer 4 includes an aggregate of third particles containing a viscosity-decreasing substance that decreases the viscosity of the melted crystallized glass material. For example, a low-viscosity glass material and/or a low-melting-temperature glass material is used as the viscosity-decreasing substance. A glass material having a high $B_2O_3$ content is preferably used as the low-viscosity glass material. A $SiO_2$—$PbO$-based glass material may be used as the low-melting-point glass material, for example. Note that the effects of such a viscosity-decreasing substance are described below in the explanation of the production method for the multilayer ceramic substrate 1.

In the multilayer ceramic substrate 1, the intercalated layer 4 is arranged such that one main surface is in contact with the base material layer 2 and the other main surface is in contact with the constraining layer 3.

Furthermore, at least a portion of the first particles contained in the base material layer 2 is in a sintered state. On the other hand, the second particles contained in the constraining layer 3 are in an unsintered state. However, the second particles are bonded to each other by a portion of the first particles containing the crystallized glass material and a portion of the third particles contained in the intercalated layer 4 diffusing or flowing into the constraining layer 3.

Preferably, a portion of the crystallized glass material contained in the base material layer 2 diffuses or flows into all portions of the constraining layer 3, and all of the second particles are bonded to each other through the portion of the crystallized glass material. Note that the crystallized glass material contained in the base material layer 2 of the multilayer ceramic substrate 1 as an end product may include a material vitrified before the baking step for sintering at least a portion of the first particles or may include a material vitrified by melting during the baking step.

In this preferred embodiment, the constraining layer 3 is thinner than the base material layer 2.

The multilayer ceramic substrate 1 further includes wiring conductors. The wiring conductors are provided to define a passive element, such as a capacitor or an inductor, or to define interconnecting wirings, such as electrical connections between elements. In general, the wiring conductors include several conductor films 5 to 7 and several via hole conductors 8.

Conductor films 5 are provided inside the multilayer ceramic substrate 1. In this preferred embodiment, although the conductor films 5 are provided along the main surfaces of the base material layers 2, the location thereof is not limited thereto. The conductor films 5 may be provided along the constraining layer 3 or the intercalated layer 4. Conductor films 6 are provided on one of the main surfaces of the multilayer ceramic substrate 1 and the conductor films 7 are provided on the other main surface. In this preferred embodiment, the conductor films 6 and 7 are provided on the base material layers 2. The via hole conductors 8 are connected to one of the conductor films 5 to 7 and penetrate particular base material layers 2 in the thickness direction.

Chip components 9 and 10 are mounted on one of the main surfaces of the multilayer ceramic substrate 1 and are electrically connected to the conductor films 6.

Figure 2:
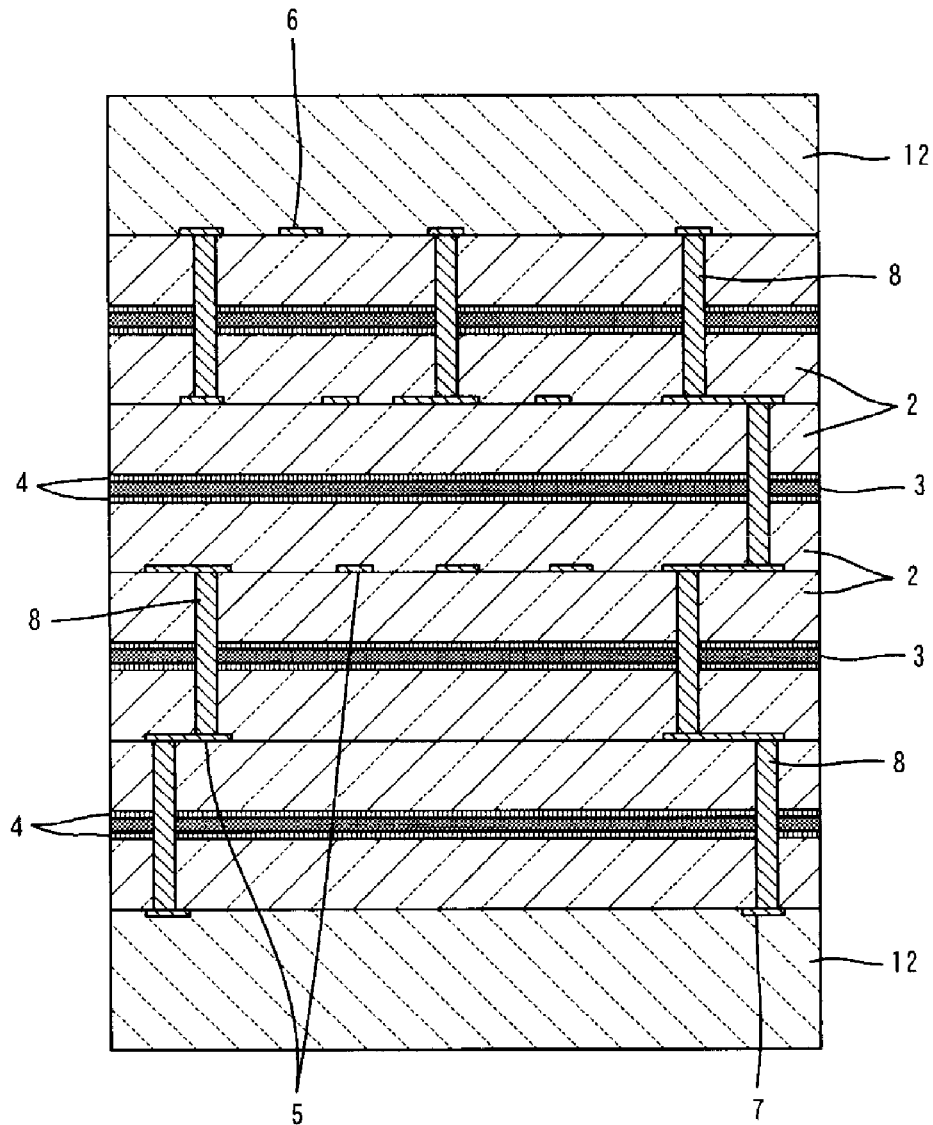
FIG. 2 is a cross-sectional view illustrating a green laminate prepared for making the multilayer ceramic substrate shown in FIG. 1.

A method for producing the multilayer ceramic substrate 1 will now be described. FIG. 2 is a cross-sectional view illustrating a green laminate 11 prepared for making the multilayer ceramic substrate 1. In FIG. 2, elements corresponding to the elements shown in FIG. 1 are represented by the same reference numerals, and description thereof is omitted to avoid redundancy. In FIG. 2, a green state before shrinking by baking is illustrated. Thus, especially the base material layers 2 are shown larger in the thickness direction than those shown in FIG. 1.

The green laminate 11 includes elements corresponding to the elements included in the multilayer ceramic substrate 1 shown in FIG. 1. In particular, the green laminate 11 includes base material layers 2 in a green state, constraining layers 3 in a green state, and intercalated layers 4 in a green state. Moreover, when the conductor films 5 to 7 and the via hole conductors 8 are to be formed by baking a conductive paste containing conductive metal particles, the green laminate 11 includes conductor films 5 to 7 and the via hole conductors 8 which are all in a green state.

The base material layers 2 in a green state includes first particles containing a crystallized glass material or a glass component capable of forming a crystallized glass material by melting during baking and a first ceramic material. For example, the base material layer 2 in a green state includes a $SiO_2$—$CaO$—$Al_2O_3$—$B_2O_3$-based glass powder as the crystallized glass material, alumina powder as the first ceramic material, water as a dispersion medium, polyvinyl alcohol as a binder, and a polycarboxylic acid-based dispersant as a dispersant.

The constraining layers 3 in a green state include second particles containing a second ceramic material that does not sinter at a temperature at which the crystallized glass is melted. For example, the constraining layers 3 in a green state include alumina powder as the second ceramic material, water as a dispersant, polyvinyl alcohol as a binder, and a polycarboxylic acid-based dispersant as a dispersant.

The intercalated layers 4 in a green state include third particles containing a viscosity-decreasing substance that decreases the viscosity of the melted crystallized glass material. When a low-viscosity glass material and/or a low-melting-point glass material is used as the viscosity-decreasing substance as described above, the intercalated layers 4 include, for example, a $SiO_2$—$CaO$—$Al_2O_3$—$MgO$—$B_2O_3$-based glass powder having a high $B_2O_3$ content, alumina powder, water as the dispersion medium, polyvinyl alcohol as a binder, and a polycarboxylic acid-based dispersant as a dispersant. Note that the $SiO_2$—$CaO$—$Al_2O_3$—$MgO$—$B_2O_3$-based glass powder having a high $B_2O_3$ content is a low-viscosity glass material. Instead, a $SiO_2$—$PbO$-based glass may be used as the low-melting-point glass material.

The conductive paste for forming the conductor films 5 to 7 and via hole conductors 8 includes, for example, Ag powder, ethyl cellulose as a binder, and a terpene as a solvent.

The green laminate 11 further includes shrinkage-inhibiting layers 12 formed on both main surfaces. The shrinkage-inhibiting layers 12 have substantially the same composition as that of the constraining layers 3 in a green state described above. Alternatively, the multilayer ceramic substrate 1 may be prepared without the shrinkage-inhibiting layers 12. Alternatively, a plurality of green laminates 11 may be laminated while being separated from one another by shrinkage-inhibiting layers 12 so that a plurality of multilayer ceramic substrates 1 can be produced in one process.

Next, if the green laminate 11 is a collective substrate, then the green laminate 11 is divided into a desired size. It is also possible to form grooves that define dividing lines in the green laminate 11, i.e., a collective substrate, bake such a green laminate 11, and divide the baked collective substrate along the dividing lines previously formed.

A step of baking the green laminate 11 is performed next. During the baking step, the conditions, such as temperature, are selected such that the following state can be produced after the baking step. That is, at least a portion of the first particles contained in the base material layer 2 is sintered as a result of the baking step. A portion of the first particles containing the crystallized glass material contained in the base material layer 2 and a portion of the third particles contained in the intercalated layer 4 diffuse or flow into the constraining layer 3. Consequently, the second particles contained in the constraining layer 3 are bonded to each other without being sintered.

A portion of the crystallized glass material contained in the base material layer 2 in the above-described baking step preferably diffuses or flows into all portions of the constraining layer 3 so that all of the second particles are bonded to each other.

During the baking step, the second particles contained in the constraining layer 3 do not sinter. Thus, the constraining layer 3 does not undergo substantial shrinkage. Accordingly, the constraining layer 3 provides a shrinkage-inhibiting effect toward the base material layer 2, and the shrinkage of the base material layer 2 in the main surface direction is prevented. Furthermore, the shrinkage-inhibiting layer 12 also provides the same shrinkage-inhibiting effect as that of the constraining layer 3 toward the base material layer 2. Accordingly, shrinkage due to baking occurs in substantially only the thickness direction of the base material layer 2. Thus, undesirable deformation of the resulting multilayer ceramic substrate 1 will not easily occur and dimensional accuracy is improved.

During the baking step, the viscosity-decreasing substance contained in the intercalated layer 4 interacts to decrease the viscosity of the melted crystallized glass material contained in the base material layer 2 and promotes permeation of the crystallized glass material into the constraining layer 3.

To be more specific, when a low-viscosity glass material, such as a glass material with a high $B_2O_3$ content, and/or a low-melting point glass material, such as a $SiO_2$—PbO-based glass material is used as the viscosity-decreasing substance, the low-viscosity glass material and/or the low-melting-point glass material mixes with the crystallized glass material in the base material layer 2 during the baking step. This physically decreases the viscosity of the melted crystallized glass material. In such a case, the thickness of the intercalated layer 4 is preferably about 2 μm to about 10 μm.

The crystallized glass material in the base material layer 2 may be a material vitrified prior to the baking step or may be a material vitrified by melting a glass component that can form a crystallized glass material during the baking step.

It is preferable to set the thickness of each base material layer 2 such that the crystallized glass material content per unit volume in each of the base material layers 2 adjacent in the thickness direction with the intercalated layers 4 and the constraining layer 3 therebetween (the residual amount after diffusion or flowing into the constraining layers 3) is substantially the same after the baking step as a result of the behavior of the crystallized glass material described above during the baking step. In this preferred embodiment, to be more specific, the base material layers 2 on both sides of the constraining layers 3 are adjusted to have substantially the same thickness.

As discussed above, since shrinkage of the base material layers 2 in the main surface direction is prevented by the constraining layers 3 and the shrinkage-inhibiting layers 12, the base material layers 2 substantially shrink in the thickness direction during the baking step. On the other hand, the conductor films 5 to 7 and the via hole conductors 8 also shrink due to the sintering of the conductive metal particles during the baking step. However, the shrinkage ratio of the conductor films 5 to 7 and the via hole conductors 8 is less than the shrinkage ratio of the base material layers 2 in the thickness direction. Consequently, projections resulting from the presence of the via hole conductors 8 would be undesirably formed in the multilayer ceramic substrate 1 after the baking step. In particular, when the via hole conductors 8 are disposed in the base material layers 2 located on the outermost side in the lamination direction, the projections are more readily formed. The shrinkage-inhibiting layers 12 are effective to prevent the formation of such projections.

The shrinkage-inhibiting layers 12 do not sinter during the baking step. The unsintered shrinkage-inhibiting layers 12 are removed after the baking step. In order to facilitate the removal of the shrinkage-inhibiting layers 12, it is preferable that the glass material does not penetrate into the shrinkage-inhibiting layers 12. Thus, it is preferable that no intercalated layer 4 be provided between the base material layer 2 and the shrinkage-inhibiting layer 12, and that the base material layers 2 be in contact with the shrinkage-inhibiting layers 12 in the green laminate 11. Moreover, as described above, in order to form the conductor films 6 and 7 on the base material layers 2, it is preferable not to form any intercalated layer 4 between the base material layers 2 and the shrinkage-inhibiting layers 12.

The conductor films 6 and 7 formed on the outer surfaces of the multilayer ceramic substrate 1 may be formed by baking the green laminate 11, removing the shrinkage-inhibiting layers 12, applying the conductive paste, and baking the applied conductive paste.

The chip components 9 and 10 are then mounted on the multilayer ceramic substrate 1 as shown in FIG. 1, as required.

Since the base material layers 2, the constraining layers 3, and the intercalated layers 4 of the multilayer ceramic substrate 1 are made of different materials, the thermal expansion coefficients thereof are usually different. In such a case, once the flowability of the glass component in the multilayer ceramic substrate 1 is lost during the cooling step after the baking step, compressive stresses will remain in the layers having a smaller thermal expansion coefficient and tensile stresses will remain in the layers having a larger expansion coefficient among the base material layers 2, the constraining layers 3, and the intercalated layers 4. In general, ceramic materials have lower strength against tensile stresses than against compressive stresses. If a critical strength for tensile stresses is reached, structural defects, such as cracks, will occur. In order to overcome this problem, it is preferable that the difference between the thermal expansion coefficient of the base material layers 2 and the thermal expansion coefficient of the intercalated layers 4 be about 2.0 ppm/° C. or less in terms of absolute values and that the difference between the thermal expansion coefficient of the constraining layers 3 and the thermal expansion coefficient of the intercalated layers 4 be about 2.0 ppm/° C. or less in terms of absolute values.

It is possible to laminate the base material layers 2, the constraining layers 3, and the intercalated layers 4 one after another to form the green laminate 11. However, it is preferable to prepare these layers in composite green sheets, which are used to form the green laminate 11, as described below.

FIGS. 3 to 7 show some examples of the composite green sheets in cross-sectional views. In FIGS. 3 to 7, the elements corresponding to the elements shown in FIG. 2 are represented by the same reference numerals. In FIGS. 3 to 7, illustration of the conductive films and the via hole conductors is omitted.

FIGS. 3 to 7 illustrate a carrier film 15 made of, for example, polyethylene terephthalate. The carrier film 15 is used to form ceramic slurry, which forms the base material layers 2, into sheets and facilitates handling of the green sheets after forming. The carrier film 15 is separated and removed after the lamination step for obtaining the green laminate 11 is completed.

Figure 3:
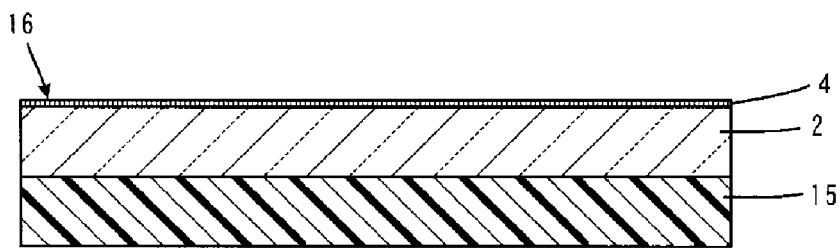
FIG. 3 is a cross-sectional view showing a first example of a composite green sheet used for preparing the green laminate.

A composite green sheet 16 shown in FIG. 3 is obtained by forming a green sheet for forming a base material layer 2 in a green state on the carrier film 15, drying the green sheet if necessary, and forming a green sheet for forming an intercalated layer 4 in a green state on the base material layer 2. In the case of this composite green sheet 16, it is easy to form a conductive film on the intercalated layer 4, although this is not shown in the drawing.

Formation of the green sheet for forming the base material layer 2 and formation of the green sheet for forming the intercalated layer 4 may be performed as a continuous process. Alternatively, the carrier film 5 retaining the green sheet for forming the base material layer 2 may be wound into a roll after the green sheet for forming the base material layer 2 is formed, and then the green sheet for forming the base material layer 2 and the carrier film 15 may be withdrawn from the roll, followed by forming of a green sheet for forming the intercalated layer 4. This also applies to the other composite green sheets 17 to 20 described with reference to FIGS. 4 to 7.

Figure 4:
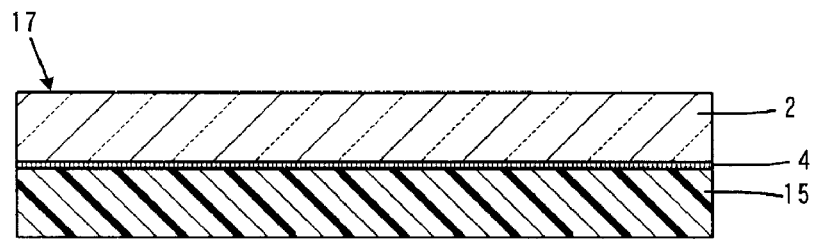
FIG. 4 is a cross-sectional view showing a second example of a composite green sheet used for preparing the green laminate.

The composite green sheet 17 shown in FIG. 4 is obtained by forming a green sheet for forming an intercalated layer 4 in a green state on the carrier film 15, drying the green sheet if necessary, and then forming a green sheet for forming a base material layer 2 in a green state. In the case of this composite green sheet 17, it is easy to form a conductive film on the base material layer 2, although this is not shown in the drawing.

The composite green sheet 16 shown in FIG. 3 has the same multilayer structure as that of the composite green sheet 17 shown in FIG. 4, after the carrier film 15 is removed.

Figure 5:
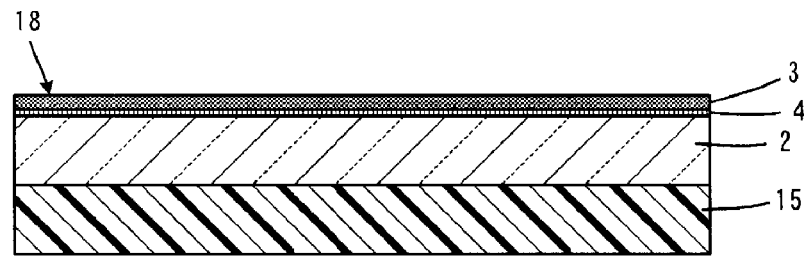
FIG. 5 is a cross-sectional view showing a third example of a composite green sheet used for preparing the green laminate.

A composite green sheet 18 shown in FIG. 5 is obtained by forming a green sheet for forming a base material layer 2 in a green state on the carrier film 15, drying the green sheet if necessary, forming a green sheet for forming an intercalated layer 4 in a green state on the base material layer 2, drying the green sheet if necessary, and then forming a green sheet for forming a constraining layer 3 in a green state on the intercalated layer 4. With this composite green sheet 18, it is easy to form a conductive film on the constraining layer 3, although this is not shown in the drawing.

Figure 6:
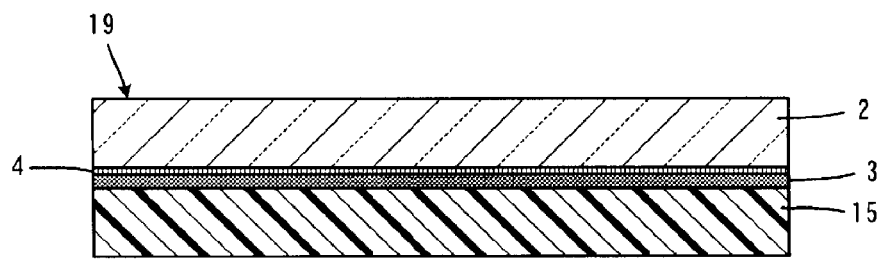
FIG. 6 is a cross-sectional view showing a fourth example of a composite green sheet used for preparing the green laminate.

A composite green sheet 19 shown in FIG. 6 is obtained by forming a green sheet for forming a constraining layer 3 in a green state on the carrier film 15, drying the green sheet if necessary, forming a green sheet for forming an intercalated layer 4 in a green state on the constraining layer 3, drying the green sheet if necessary, and then forming a green sheet for forming a base material layer 2 in a green state on the intercalated layer 4. With this composite green sheet 19, it is easy to form a conductive film on the base material layer 2, although this is not shown in the drawing.

The composite green sheet 18 shown in FIG. 5 has the same multilayer structure as that of the composite green sheet 19 shown in FIG. 6, after the carrier film 15 is removed.

Figure 7:
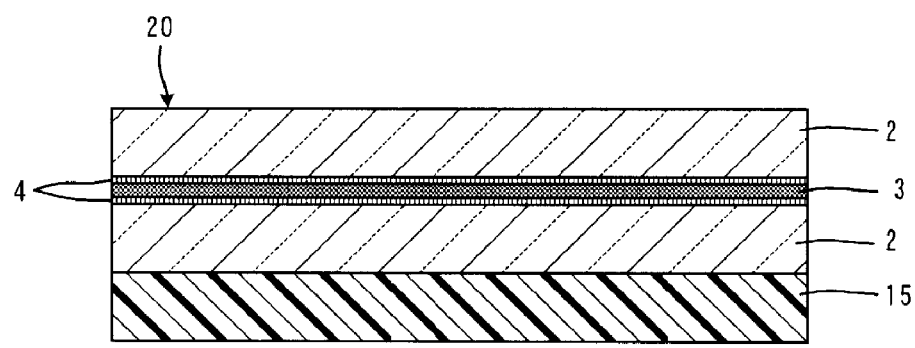
FIG. 7 is a cross-sectional view showing a fifth example of a composite green sheet used for preparing the green laminate.

A composite green sheet 20 shown in FIG. 7 is obtained by forming a green sheet for forming a base material layer 2 in a green state, a green sheet for forming an intercalated layer 4, a green sheet for forming a constraining layer 3 in a green state, a green sheet for forming another intercalated layer 4 in a green state, and a green sheet for forming a base material layer 2 in that order on the carrier film 15. With this composite green sheet 20, it is easy to form a conductor film on the base material layer 2, although this is not shown in the drawing.

A green laminate 11 can be prepared by using one of or a combination of the composite green sheets 16 to 20 described above. For example, a green laminate 11 can be prepared by combining the composite green sheet 16 or 17 with the composite green sheet 18 or 19. Alternatively, a green laminate 11 can be prepared by stacking a plurality of composite green sheets 20.

Figure 8:
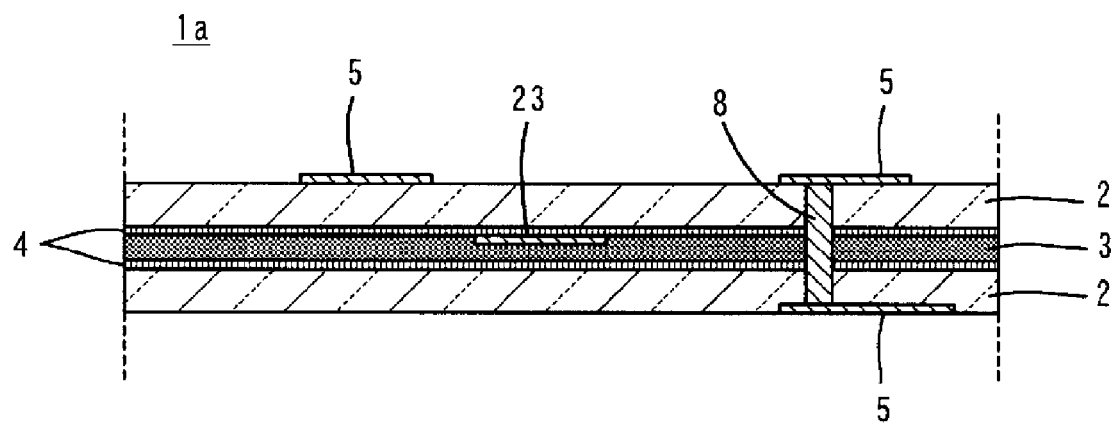
FIG. 8 is a cross-sectional view illustrating part of a multilayer ceramic substrate according to a second preferred embodiment of the present invention.

FIG. 8 is a cross-sectional view illustration a portion of a multilayer ceramic substrate 1a according to a second preferred embodiment of the present invention. In FIG. 8 a portion of the multilayer ceramic substrate 1a in the lamination direction is illustrated. Furthermore, in FIG. 8, elements corresponding to the elements shown in FIG. 1 are referred to by the same reference numerals, and description thereof is omitted to avoid redundancy.

The multilayer ceramic substrate 1a shown in FIG. 8 includes a conductor film 23 arranged to extend along a main surface of the intercalated layer 4 or the constraining layer 3. As understood from this preferred embodiment, the conductive film may be arranged along a main surface of any of the base material layers 2, the constraining layer 3, and the intercalated layers 4.

For example, in order to use a particular electromagnetic property of the base material layer 2, the conductor film 5 is formed along a main surface of the base material layer 2. In order to use a particular electromagnetic function of the constraining layer 3, a conductive film 23 is formed along a main surface of the constraining layer 3. Accordingly, a powder having a desired property, such as an electrical insulation property, a dielectric property, a piezoelectric property, or a magnetic property, may be used as the first particles included in the base material layer 2 or the second particles included in the constraining layer 3 as required. In this manner, a particular electromagnetic function can be applied to the multilayer ceramic substrate 1a.

Figure 9:
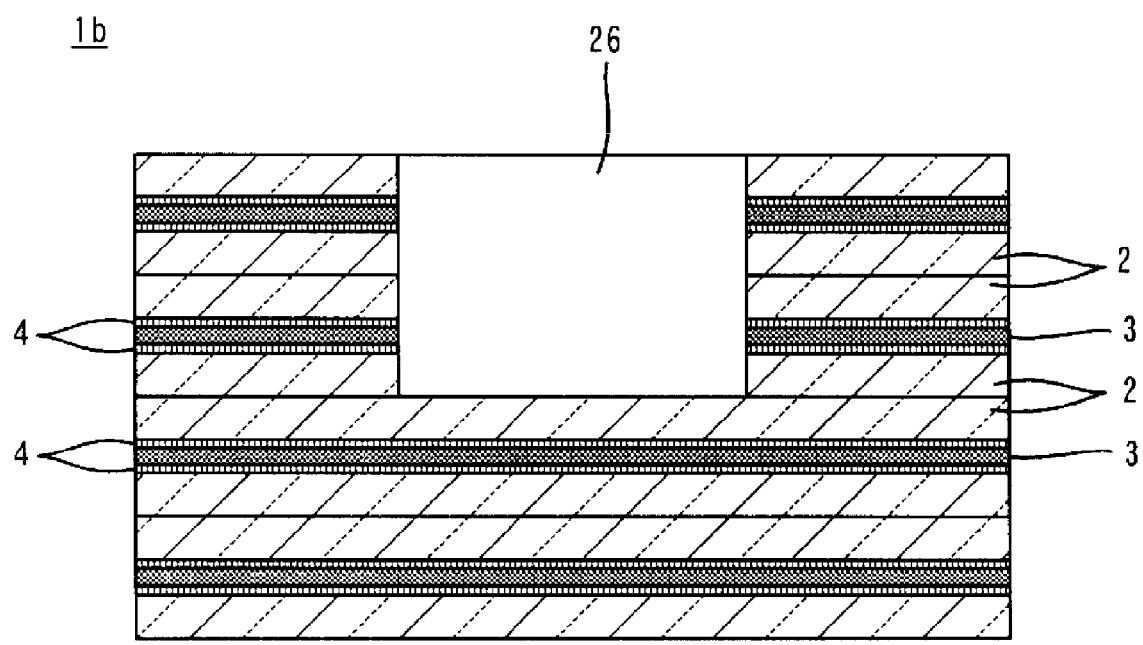
FIG. 9 is a cross-sectional view illustrating a multilayer ceramic substrate according to a third preferred embodiment of the present invention.

FIG. 9 is a cross-sectional view illustrating a multilayer ceramic substrate 1b of a third preferred embodiment of the present invention. In FIG. 9, elements corresponding to the elements shown in FIG. 1 are referred to by the same reference numerals, and description thereof is omitted to avoid redundancy. Note that in FIG. 9, illustration of wiring conductors, such as conductive films and via hole conductors, is omitted from the drawing.

The multilayer ceramic substrate 1b shown in FIG. 9 includes a cavity 26 having an opening along one main surface of the multilayer ceramic substrate 1b. A chip component is mounted in the cavity 26, although this is not shown in the drawing. In order to form a multilayer ceramic substrate 1b having such a cavity 26, the cavity 26 is formed at the stage in which the laminate is green. Accordingly, when a plurality of green sheets is laminated to form a green laminate, penetrating holes that will form a cavity 26 are formed in advance in particular ones of a plurality of green sheets.

During baking of the green laminate, undesirable deformation is likely to occur if a cavity is formed therein. Thus, the advantage of the present invention to prevent deformation is particularly effectively exhibited in forming a multilayer ceramic substrate 1b having a cavity 26 shown in FIG. 9.

FIGS. 10 to 13 are cross-sectional views illustrating multilayer ceramic substrates 1c, 1d, 1e, and if according to fourth to seventh preferred embodiments of the present invention, respectively. The multilayer ceramic substrates 1c, 1d, 1e, and if respectively shown in FIGS. 10 to 13 are modifications of the multilayer ceramic substrate 1b having the cavity 26 shown in FIG. 9. In FIGS. 10 to 13, the elements corresponding to the elements shown in FIG. 9 are represented by the same reference numerals, and description thereof is omitted to avoid redundancy. Note that in FIGS. 10 to 13 also, the wiring conductors, such as conductive films and via hole conductors, are omitted from the drawing.

With respect to a multi ceramic substrate having a cavity, in both of the sidewall portion extending upward from the bottom of the cavity to surround the cavity and the bottom wall portion below the bottom of the cavity shrink during baking, stresses may occur. Thus, there is a possibility that defects, such as cracks or other defects, will occur at the interface between the sidewall portion and the bottom wall portion.

Thus, in the multilayer ceramic substrates 1c, 1d, 1e, and 1f respectively shown in FIGS. 10 to 13, a constraining layer 3 is formed along the interface between a sidewall portion 27 and a bottom wall portion 28. In this manner, both the sidewall portion 27 and the bottom wall portion 28 are constrained by the constraining layer 3 and shrinkage of each portion is prevented during baking. Thus, cracks and other defects do not easily occur.

Figure 10:
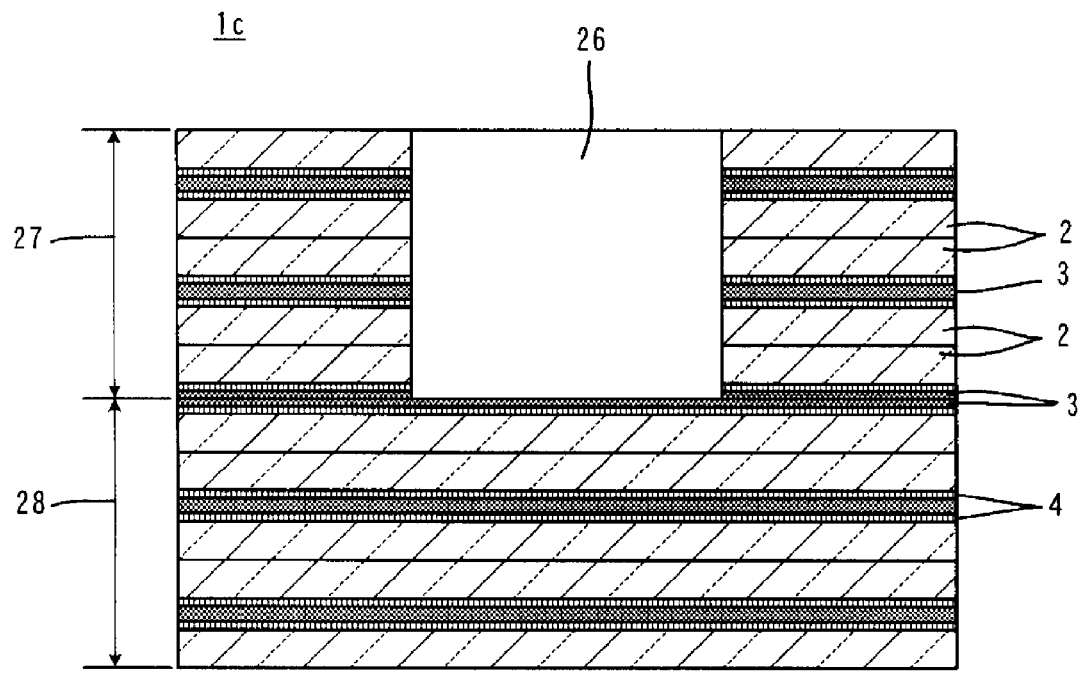
FIG. 10 is a cross-sectional view illustrating a multilayer ceramic substrate according to a fourth preferred embodiment of the present invention.

To be more specific, in the multilayer ceramic substrate 1c shown in FIG. 10, the constraining layers 3 are arranged such that the bottom surface of the cavity 26 is defined by the constraining layer 3 and the constraining layers 3 are arranged at the both sides of the interface between the sidewall portion 27 and the bottom wall portion 28.

Figure 11:
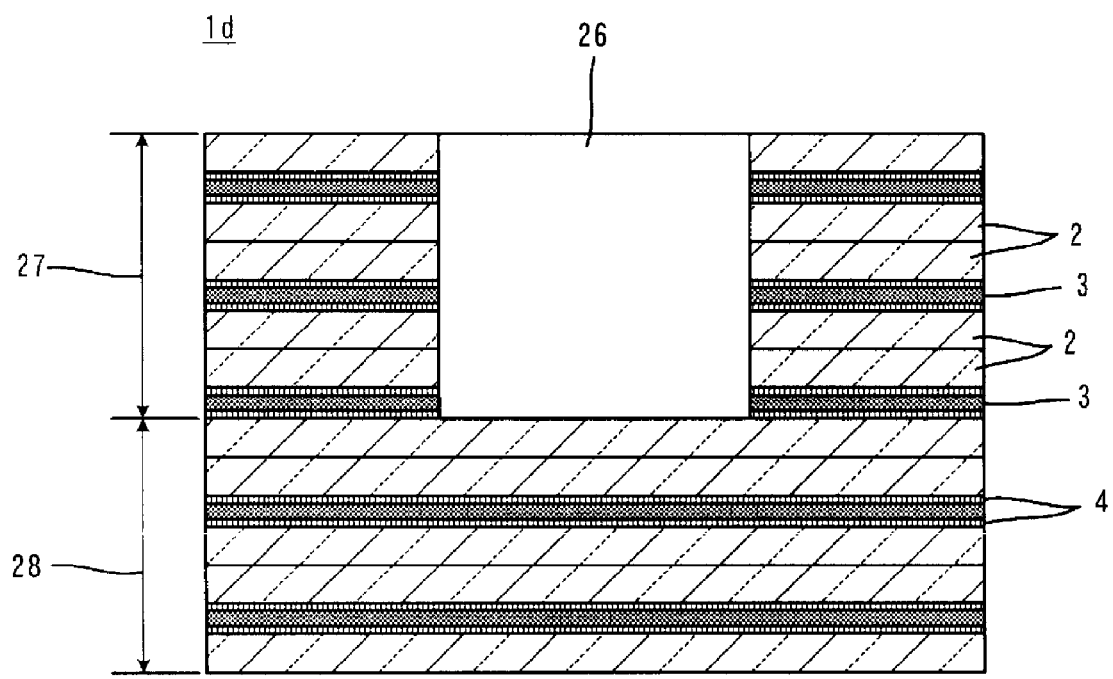
FIG. 11 is a cross-sectional view illustrating a multilayer ceramic substrate according to a fifth preferred embodiment of the present invention.

In the multilayer ceramic substrate 1d shown in FIG. 11, although the bottom surface of the cavity 26 is defined by a base material layer 2, a constraining layer 3 is arranged in the sidewall portion 27 near the bottom wall portion 28.

Figure 12:
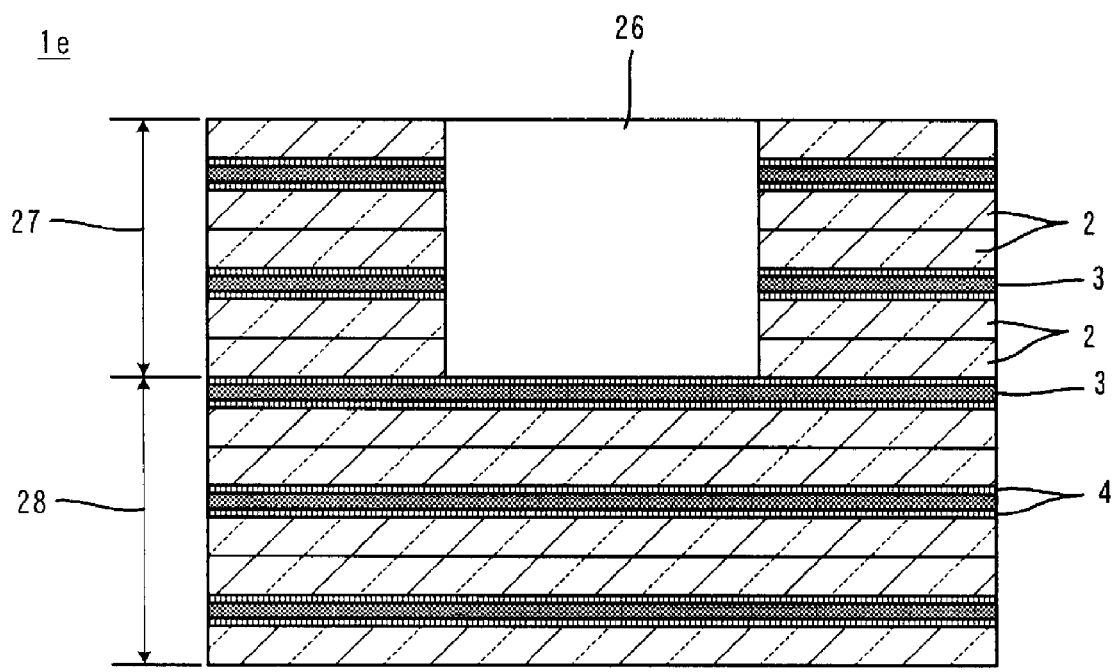
FIG. 12 is a cross-sectional view illustrating a multilayer ceramic substrate according to a sixth preferred embodiment of the present invention.

In the multilayer ceramic substrate 1e shown in FIG. 12, although the bottom surface of the cavity 26 is defined by an intercalated layer 4, a constraining layer 3 is arranged at a position near the interface between the sidewall portion 27 and the bottom wall portion 28.

Figure 13:
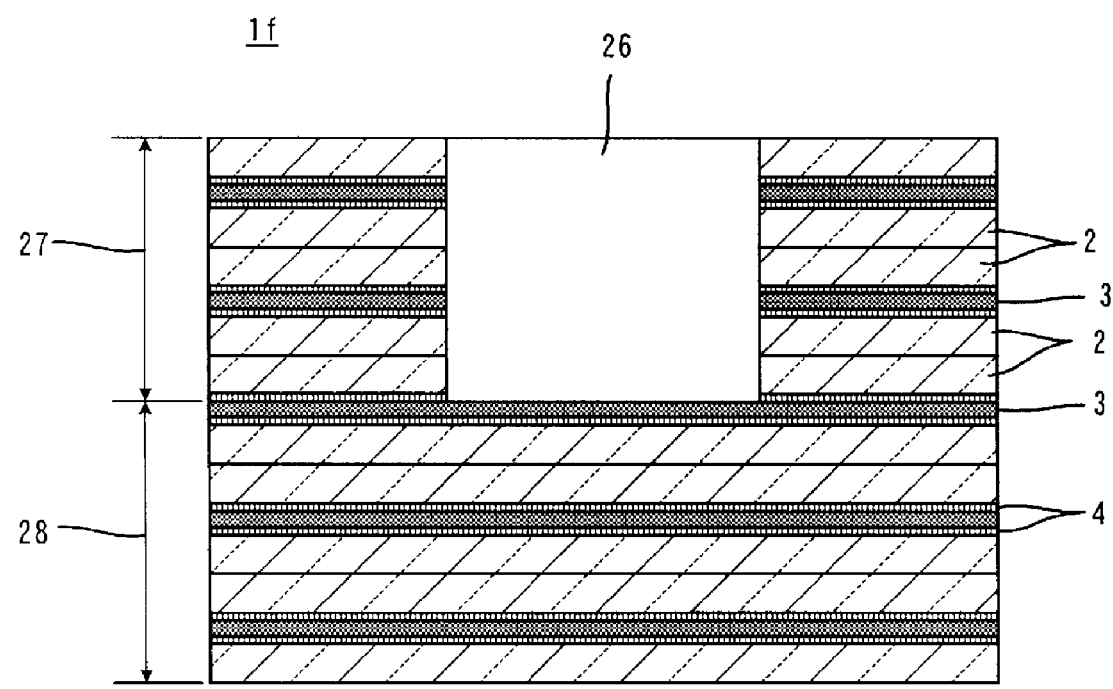
FIG. 13 is a cross-sectional view illustrating a multilayer ceramic substrate according to a seventh preferred embodiment of the present invention.

In the multilayer ceramic substrate 1f shown in FIG. 13, the constraining layer 3 is arranged such that the bottom surface of the cavity 26 is defined by the constraining layer 3.

Among these multilayer ceramic substrates 1c to 1f, the multilayer ceramic substrate 1c shown in FIG. 10 can most effectively prevent shrinkage since the constraining layers 3 are formed on both the sidewall-portion-27-side and the bottom-wall-portion-28-side of the interface between the sidewall portion 27 and the bottom wall portion 28.

Examples of the experiments conducted to confirm the effects of preferred embodiments of the present invention will now be described.

EXPERIMENTAL EXAMPLE 1

1. Preparation of Samples

In this Experimental Example, the following samples 1 to 5 of multilayer ceramic substrates were prepared.

(1) Sample 1

Figure 14:
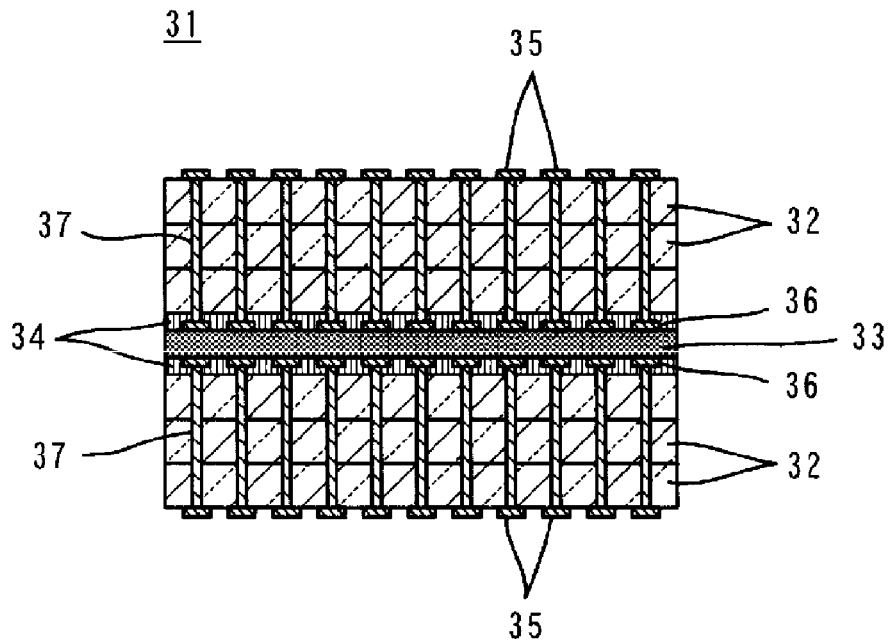
FIG. 14 is a front cross-sectional view of a green laminate of Samples 1 and 5 prepared in Experimental Example 1.

Sample 1 corresponds to a preferred embodiment according to the present invention and is obtained by baking a green laminate 31 having a structure shown in FIG. 14. FIG. 14 is a front view showing a section of the green laminate 31.

The green laminate 31 includes base material layers 32, constraining layers 33, and intercalated layers 34 all in a green state. The green laminate 31 has a structure in which three base material layers 32 are laminated on each side of each constraining layer 33 with an intercalated layer 34 therebetween. A plurality of external conductor films 35 are formed on the upper main surface and the lower main surface of the green laminate 31, and internal conductor films 36 are formed inside the green laminate 31. The internal conductor films 36 are formed on each main surface of the constraining layer 33. A plurality of via hole conductors 37 that penetrate the base material layers 23 and connect the external conductor films 35 to the internal conductor films 36 are formed in the green laminate 31.

Green sheets for forming the base material layers 32 of the green laminate 31 having the above-described structure were prepared as follows. That is, 50 parts by weight of a crystallized glass $SiO_2$—$CaO$—$Al_2O_3$—$B_2O_3$ (44:47:5:4)-based glass powder which deposited wallastonite having an average particle diameter of about 2 μm, 50 parts by weight of alumina powder having an average particle diameter of about 1.5 μm, 50 parts by weight of water as a dispersion medium, 20 parts by weight of polyvinyl alcohol as a binder, and 1 part by weight of a polycarboxylic acid-based dispersant were mixed to prepare a slurry. Bubbles were removed from the slurry, and the resulting slurry was formed into sheets by a doctor blade method, followed by drying to prepare green sheets for forming base material layers 32 having a thickness of about 30 μm.

Green sheets for forming constraining layers 33 in the green laminate 31 were prepared as follows. That is, 100 parts by weight of alumina powder having an average particle diameter of about 1 μm, 50 parts by weight of water as a dispersion medium, 20 parts by weight of polyvinyl alcohol as a binder, and 1 part by weight of a polycarboxylic acid-dispersant were mixed to prepare a slurry. Bubbles were then removed from the slurry, and the resulting slurry was formed into sheets by a doctor blade method, followed by drying to obtain green sheets for forming constraining layers 33 having a thickness of about 10 μm.

Green sheets for forming intercalated layers 34 in the green laminate 31 were prepared as follows. That is, 50 parts by weight of $SiO_2$—$CaO$—$Al_2O_3$—$MgO$—$B_2O_3$ (36:13:24:2:24)-based glass powder having an average particle diameter of about 4 μm not crystallizable by itself, 50 parts by weight of alumina powder having an average particle diameter of about 0.35 μm, 50 parts by weight of water as a dispersion medium, 20 parts by weight of polyvinyl alcohol as a binder, and 1 part by weight of polycarboxylic acid-based dispersant as a dispersant were mixed to prepare a slurry. Bubbles were removed from the slurry, and the resulting slurry was formed into sheets by a doctor blade method, followed by drying, to prepare green sheets for forming intercalated layers 34 having a thickness of about 4 μm.

A conductive paste containing 48 parts by weight of Ag powder having an average particle diameter of about 2 μm, 3 parts by weight of ethyl cellulose as a binder, and 49 parts by weight of a terpene as a solvent was prepared as a conductive paste for forming external conductor films 35, internal conductor films 36, and via hole conductors 37. Particular ones of the green sheets for forming the base material layers 32 and particular ones of the green sheets for forming the constraining layers 33 were subjected to steps for forming the external conductor films 35, the internal conductor films 36, and the via hole conductors 37. During these steps, the conductive paste was applied.

Next, the green sheets described above are laminated and press-bonded to prepare the green laminate 31 shown in FIG. 14. The thickness of the green laminate 31 was about 0.1 mm after baking. The green laminate 31 was then cut to a planar dimension of about 30 mm×about 30 mm.

The green laminate 31 was then baked for 20 minutes at about 860° C., about 880° C., about 900° C., or about 920° C. to prepare a multilayer ceramic substrate of Sample 1.

(2) Sample 2

Figure 15:
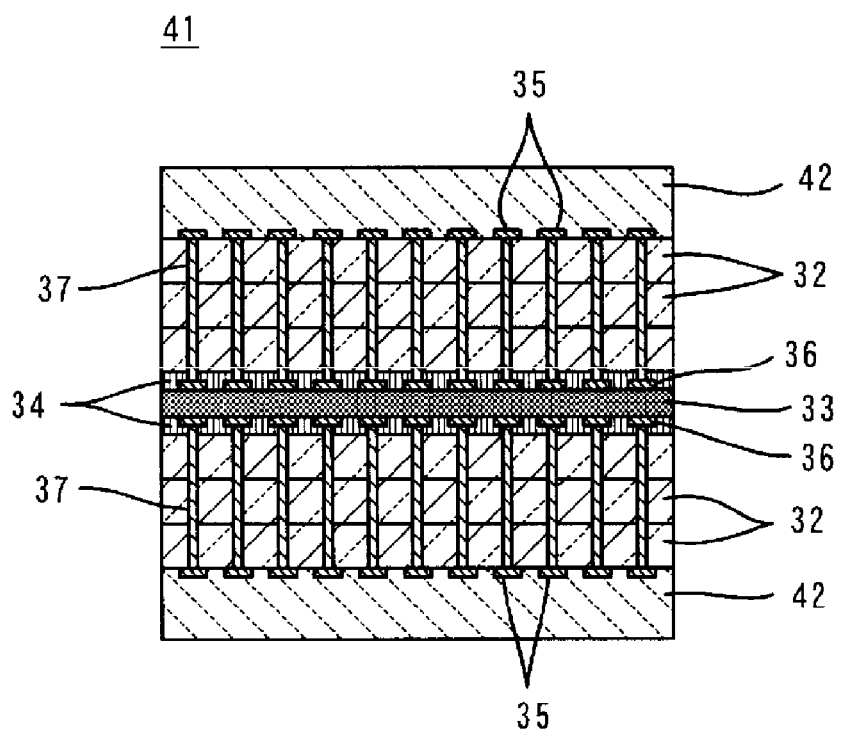
FIG. 15 is a front cross-sectional view of a green laminate of Sample 2 prepared in Experimental Example 1.

Sample 2 corresponds to a preferred embodiment according to the present invention and is obtained by baking a green laminate 41 having a structure shown in FIG. 15. FIG. 15 is a front view showing a section of the green laminate 41. In FIG. 15, the elements corresponding to the elements shown in FIG. 14 are represented by the same reference numerals, and description thereof is omitted to avoid redundancy.

The green laminate 41 of Sample 2 is different from the green laminate 31 of Sample 1 in that shrinkage-inhibiting layers 42 are respectively provided on the two main surfaces thereof. Green sheets having the same composition as that of the green sheets for forming the constraining layer 33 and a thickness of about 50 μm were prepared as the green sheets for forming the shrinkage-inhibiting layers 42. After the baking step, the shrinkage-inhibiting layers 42 were removed. Other than this, a multilayer ceramic substrate of Sample 2 was prepared by the same method as Sample 1.

(3) Sample 3

Figure 16:
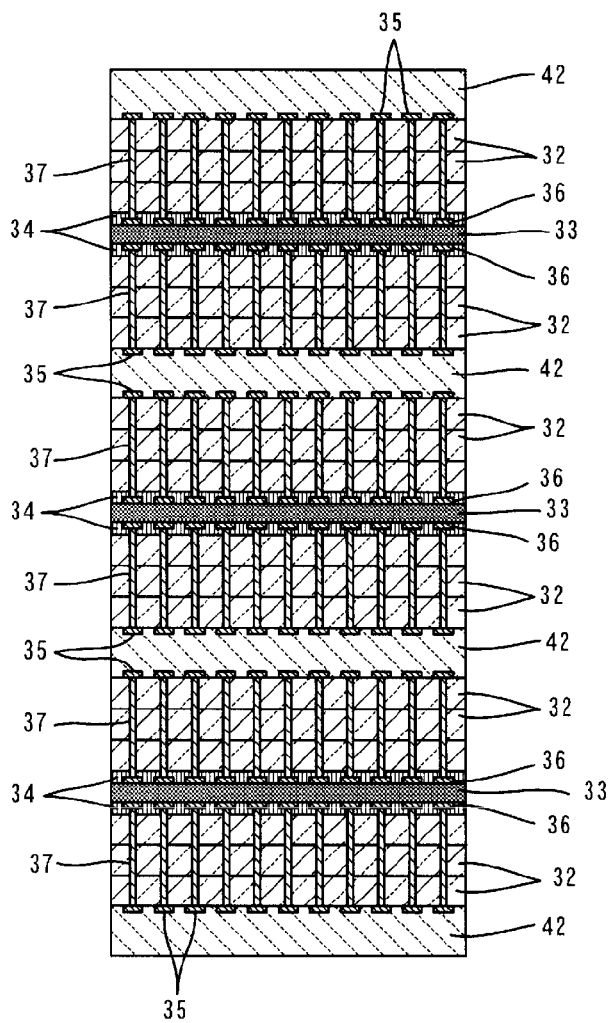
FIG. 16 is a front cross-sectional view of a green laminate of Sample 3 prepared in Experimental Example 1.

Sample 3 corresponds to a preferred embodiment according to the present invention and is obtained by baking a green laminate 45 having a structure shown in FIG. 16. FIG. 16 is a front view showing a section of the green laminate 45. In FIG. 16, the elements corresponding to the elements shown in FIG. 15 are represented by the same reference numerals, and description thereof is omitted to avoid redundancy.

The green laminate 45 of Sample 3 has a structure in which three laminates each corresponding to the green laminate 31 of Sample 1 are laminated with shrinkage-inhibiting layers 42 therebetween and other shrinkage-inhibiting layers 42 are provided on the two ends of the laminate. As with the case of Sample 2, green sheets having the same composition as the green sheets for forming the constraining layers 33 and a thickness of about 50 μm were prepared as the green sheets for forming the shrinkage-inhibiting layers 42. After the baking step, the shrinkage-inhibiting layers 42 were removed to obtain three multilayer ceramic substrates. Other than this, the laminate was prepared as in Sample 1.

(4) Sample 4

Figure 17:
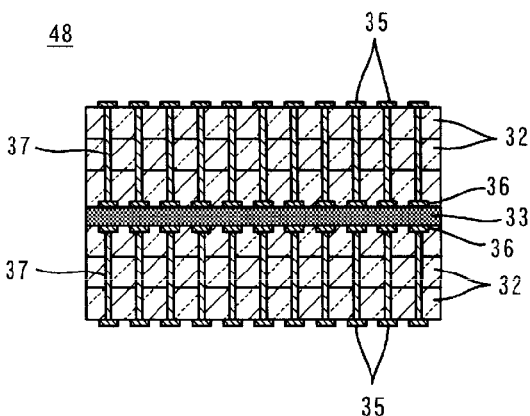
FIG. 17 is a front-cross sectional view of a green laminate of Sample 4 prepared in Experimental Example 1.

Sample 4 corresponds to a comparative example outside the scope of the present invention and is obtained by baking a green laminate 48 having the structure shown in FIG. 17. In FIG. 17, the elements corresponding to the element shown in FIG. 14 are represented by the same reference numerals, and description thereof is omitted to avoid redundancy. The green laminate 48 shown in FIG. 17 is different from the green laminate 31 shown in FIG. 14 in that no intercalated layer 34 is provided therein.

A multilayer ceramic substrate of Sample 4 was prepared by the same method as in Sample 1 except that no green sheets for forming the intercalated layers 34 were used so that the green laminate 48 having a structure shown in FIG. 17 was obtained.

(5) Sample 5

Sample 5 corresponds to a comparative example outside the scope of the present invention and is obtained by baking a green laminate 31 having the structure shown in FIG. 14. However, the composition of the green sheets for forming the intercalated layer 34 is different.

Green sheets for forming the intercalated layers 34 were prepared as follows. That is, 100 parts by weight of copper oxide powder having an average particle diameter of about 1 μm, 50 parts by weight of alumina powder having an average particle diameter of about 1.5 μm, 50 parts by weight of water as a dispersion medium, 20 parts by weight of polyvinyl alcohol as a binder, and 1 part by weight of a polycarboxylic acid-based dispersant as a dispersant were mixed to prepare a slurry. Bubbles were then removed from the slurry, and the resulting slurry was formed in to sheets by a doctor blade method, followed by drying, to obtain green sheets for forming intercalated layers 34 having a thickness of about 4 μm.

Other than this, a multilayer ceramic substrate of Sample 5 was prepared by the same method as in Sample 1.

2. Evaluation

For Samples 1 to 5 described above, X-Y direction shrinkage ratio by baking, water absorption of the multilayer ceramic substrate, warpage, and the amount of projection at the surface of the multilayer ceramic substrate caused by via hole conductors were evaluated. These evaluations were conducted on specimens obtained by baking at about 860° C., about 880° C., about 900° C., and about 920° C., respectively. Table 1 shows evaluation results of the X-Y direction shrinkage ratio; Table 2 shows evaluation results of the water absorption; Table 3 shows evaluation results of the warpage; and Table 4 shows the amount of projection.

TABLE 1

<<X-Y direction Shrinkage Ratio [%]>>

| Sample | Baking temperature [° C.] | | | |
|---|---|---|---|---|
| No. | 860 | 880 | 900 | 920 |
| 1 | 0.4 | 0.4 | 0.4 | 0.5 |
| 2 | 0.3 | 0.3 | 0.3 | 0.3 |
| 3 | 0.3 | 0.3 | 0.3 | 0.3 |
| 4 | 0.4 | 0.5 | 0.5 | 0.5 |
| 5 | 0.4 | 0.4 | 0.5 | 0.4 |

TABLE 2

<<Water absorption [%]>>

| Sample | Baking temperature [° C.] | | | |
|---|---|---|---|---|
| No. | 860 | 880 | 900 | 920 |
| 1 | 0.1 | 0 | 0 | 0 |
| 2 | 0.1 | 0 | 0 | 0 |
| 3 | 0.1 | 0 | 0 | 0 |
| 4 | — | 1.2 | 0.8 | 0.5 |
| 5 | 0.8 | 0.5 | 0.3 | 0.3 |

TABLE 3

<<Warpage [μm]>>

| Sample | Baking temperature [° C.] | | | |
|---|---|---|---|---|
| No. | 860 | 880 | 900 | 920 |
| 1 | 11 | 28 | 36 | 62 |
| 2 | 4 | 3 | 4 | 4 |
| 3 | 4 | 5 | 5 | 5 |
| 4 | 8 | 24 | 30 | 52 |
| 5 | 10 | 26 | 32 | 58 |

TABLE 4

<<Amount of projection [μm]>>

| Sample | Baking temperature [° C.] | | | |
|---|---|---|---|---|
| No. | 860 | 880 | 900 | 920 |
| 1 | 30 | 35 | 37 | 33 |
| 2 | 7 | 6 | 7 | 9 |
| 3 | 8 | 7 | 5 | 8 |
| 4 | 30 | 32 | 34 | 34 |
| 5 | 33 | 31 | 34 | 36 |

As shown in Table 1, all of the specimens prepared exhibited an X-Y direction shrinkage ratio during baking in the range of about 0.3 to about 0.5%.

When compared with the moisture absorption shown in Table 2, Samples 1 to 3 of preferred embodiments of the present invention exhibited a water absorption of 0% at a baking temperature of 880° C. That the water absorption is 0% indicates that the crystallized glass material smoothly penetrated into the constraining layers 33 to sufficiently densify the constraining layer 33.

In contrast, for Samples 4 and 5 which are comparative examples, although Sample 5 underwent a decrease in water absorption at a baking temperature less than that of Sample 4, neither Sample 4 nor Sample 5 exhibited a water absorption of about 0% at a baking temperature not more than about 920° C. There is no water absorption data for Sample 4 at a baking temperature of about 860° C. This is because hardly any glass material penetrated into the constraining layers, and thus, the substrates were separated from the constraining layers, thereby failing to form an integral member.

The moisture absorption of Sample 5 showed a decrease at a lower baking temperature than that of Sample 4. This is because, as described above with reference to FIG. 14, Sample 5 was obtained by baking the green laminate 31 having the intercalated layers 34. However, the intercalated layers 34 contained copper oxide as an oxide of a transition element. An oxide of a transition element, such as copper oxide, cleaves oxygen bridges in the crystallized glass material in an unstable state. Thus, at the initial state, the oxide causes a decrease in viscosity of the crystallized glass material. However, the oxide subsequently promotes crystallization of the glass material as the glass material becomes more unstable and causes a further increase in viscosity of the glass material. Thus, in Sample 5, the glass material did not smoothly permeate into the constraining layers 33, and the water absorption could not be decreased to about 0%, thereby failing to sufficiently densify the constraining layers 33, as described above.

Next, for the warpage shown in Table 3, Samples 1 to 5 all exhibited a warpage tendency increase with an increase in baking temperature. In particular, when Samples 1 to 3 which are within the scope of the present invention are compared with each other, the warpage could be significantly decreased in Samples 2 and 3, since Samples 2 and 3 included the green laminates 41 and 45 to be baked that included the shrinkage-inhibiting layers 42, as shown in FIGS. 15 and 16, when compared with Sample 1 that did not have any shrinkage-inhibiting layer in the green laminate 31, as shown in FIG. 14. In Samples 4 and 5 which were outside the scope of the present invention, warpage could not be sufficiently inhibited since the green laminates 48 and 31 did not include any shrinkage-inhibiting layer, as shown in FIGS. 17 and 14 as in Sample 1.

For the amount of projection shown in Table 4, when Samples 1 to 3 that were within the scope of the present invention are compared with each other, the projection amount could be significantly decreased in Samples 2 and 3 since Samples 2 and 3 included the green laminates 41 and 45 to be baked that had the shrinkage-inhibiting layers 42, as shown in FIGS. 15 and 16, when compared with Sample 1 that did not have any shrinkage-inhibiting layer in the green laminate 31, as shown in FIG. 14. In Samples 4 and 5 which were outside the scope of the present invention, the projection amount could not be sufficiently inhibited since the green laminates 48 and 31 did not include any shrinkage-inhibiting layer, as shown in FIGS. 17 and 14 as in Sample 1.

EXPERIMENTAL EXAMPLE 2

This Experimental Example was conducted to determine favorable relationships between thermal expansion coefficients of the base material layers, constraining layers, and intercalated layers in the multilayer ceramic substrate.

1. Preparation of Green Sheets (1) Green Sheets for Base Material Layers

Fifty parts by weight of $SiO_2$—CaO—$Al_2O_3$—$B_2O_3$ (44:47:5:4)-based glass powder having an average particle diameter of about 2 μm that deposited wallastonite, 50 parts by weight of alumina powder having an average particle diameter of about 1.5 μm, 50 parts by weight of water as a dispersion medium, 20 parts by weight of polyvinyl alcohol as a binder, and 1 part by weight of a polycarboxylic acid-based dispersant as a dispersant were mixed to prepare a slurry. Bubbles were removed from this slurry, and the resulting slurry was formed into sheets by a doctor blade method, followed by drying, to obtain green sheets for forming the base material layers having a thickness of about 100 μm.

The green sheets for base material layers were baked and the thermal expansion coefficient ($\alpha 1$) was determined. The result was about 8.3 ppm/° C.

(2) Green Sheets for Constraining Layers

TABLE 5

| Reference No. of constraining layers | Ceramic powder | Thermal expansion coefficient ($\alpha 2$) [ppm/° C.] |
|---|---|---|
| R1 | $Al_2O_3$ | 5.2 |
| R2 | $TiO_2$ | 7.1 |
| R3 | $TiO_2 + La_2Ti_2O_7$(75:25) | 7.6 |
| R4 | $TiO_2 + La_2Ti_2O_7$(50:50) | 8.3 |
| R5 | $La_2Ti_2O_7$ | 10.3 |

As shown in Table 5, five types of green sheets R1 to R5 for constraining layers were prepared.

In particular, 100 parts by weight of ceramic powder of a type indicated in the column of "Ceramic powder" in Table 5 having an average particle diameter of about 0.5 μm, 50 parts by weight of water as a dispersion medium, 20 parts by weight of polyvinyl alcohol as a binder, and 1 part by weight of a polycarboxylic acid-based dispersant as a dispersant were mixed to prepare a slurry. Bubbles were removed from the slurry, and the resulting slurry was formed into sheets by a doctor blade method, followed by drying to obtain green sheets having a thickness of about 15 μm for forming constraining layers. For the constraining layers R3 and R4 shown in Table 5, the ratios "75:25" and "50:50" described in the column of "Ceramic powder" each indicate a weight ratio of $TiO_2$ to $La_2Ti_2O_7$.

The green sheets R1 to R5 for forming constraining layers were baked and the thermal expansion coefficient ($\beta 2$) was determined. The values shown in the column of "Thermal expansion coefficient" were obtained. Since the green sheets for forming constraining layers cannot form a dense sinter by themselves, the thermal expansion coefficients shown in Table 5 were determined by calculating the amount of glass permeated on the basis of the occupation ratio of voids existent between the ceramic particles of the sintered constraining layers and then linearly approximating the relationship between the amount of glass permeated and the thermal expansion coefficient.

(3) Green Sheets for Intercalated Layers

TABLE 6

| Reference No. of intercalated layers | Ceramic powder Type | Content [wt %] | Thermal expansion coefficient ($\alpha 3$) [ppm/° C.] |
|---|---|---|---|
| B1 | — | 0 | 4.2 |
| B2 | $La_2Ti_2O_7$ | 20 | 6.3 |
| B3 | $La_2Ti_2O_7$ | 40 | 8.5 |
| B4 | $Al_2O_3$ | 40 | 4.9 |

Four types of green sheets B1 to B4 for forming intercalated layers were prepared as shown in Table 6.

In particular, 100 parts by weight of a mixed powder prepared by mixing a $SiO_2$—CaO—$Al_2O_3$—MgO—$B_2O_3$ (36:

13:24:2:24)-based glass powder having an average particle diameter of about 4 μm and a ceramic powder having an average particle diameter of about 0.5 μm indicated in the column of "Type" under "Ceramic powder" in Table 6 such that the ceramic powder content was as shown in the column of "Content" under "Ceramic powder", 50 parts by weight of water as a dispersant, 20 parts by weight of polyvinyl alcohol as a binder, and 1 part by weight of polycarboxylic acid-based dispersant as a dispersant were mixed to prepare a slurry. Bubbles were removed from the slurry, and the resulting slurry was formed into sheets by a doctor blade method, followed by drying to obtain green sheets having a thickness of about 10 μm for forming the intercalated layers.

The green sheets B1 to B4 for forming the intercalated layers were sintered and then the thermal expansion coefficient was determined. Values shown in the column of "Thermal expansion coefficient" in Table 6 were obtained.

2. Preparation of Multilayer Ceramic Substrate

Figure 18:
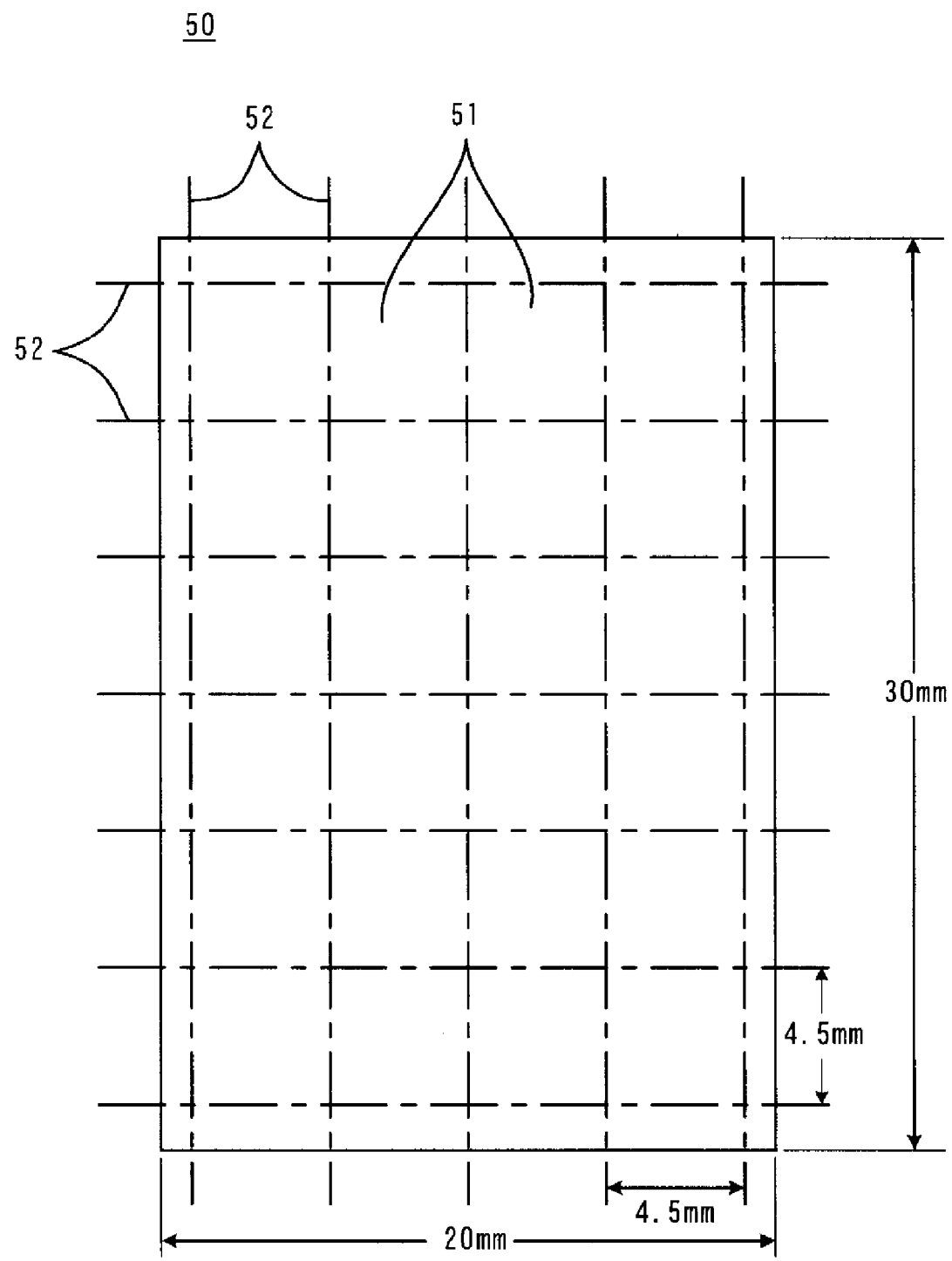
FIG. 18 is a plan view showing the appearance of a mother substrate, before dicing, for obtaining samples of multilayer ceramic substrates in Experimental Example 2.
Figure 19A:
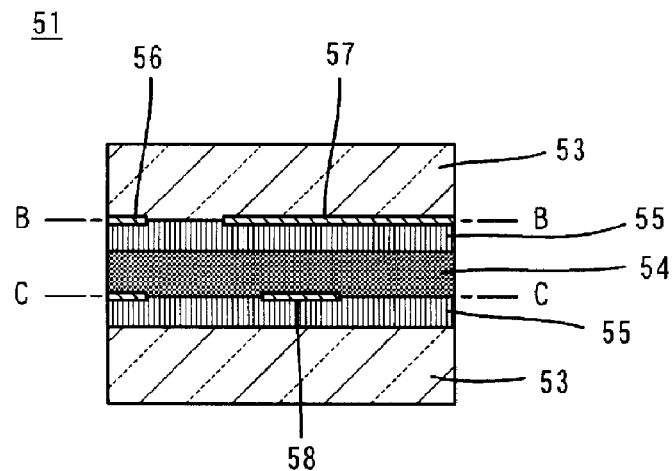
Figure 19B:
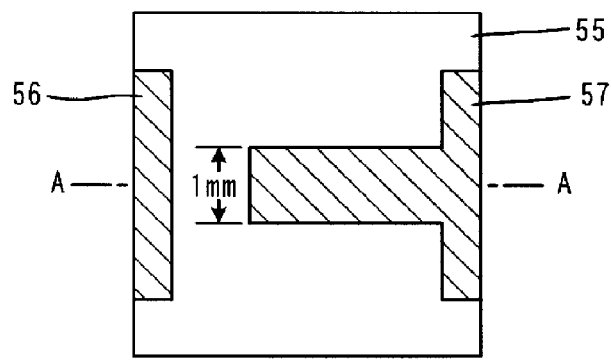
Figure 19C:
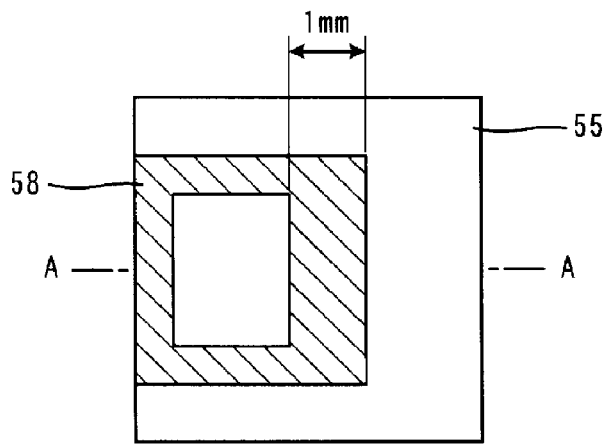

FIG. 18 is a plan view showing the appearance of a mother substrate 50, before dicing, for obtaining samples of multilayer ceramic substrates 51. FIGS. 19A-19C show samples of a multilayer ceramic substrate 51 obtained by dicing the mother substrate 50 shown in FIG. 18. FIG. 19A is a cross-sectional view taken along line A-A in FIG. 19B or 19C; FIG. 19B is a cross-sectional view taken along line B-B in FIG. 19A; and FIG. 19C is a cross-sectional view taken along line C-C in FIG. 19A.

The multilayer ceramic substrate 51 shown in FIG. 19 was obtained by dicing the mother substrate 50 shown in FIG. 18 along dividing lines 52. As shown in FIG. 18, the mother substrate 50 preferably has planar dimensions of about 20 mm×about 30 mm. Each multilayer ceramic substrate 51 preferably has planar dimensions of about 4.5 mm×about 4.5 mm.

As shown in FIG. 19A, the multilayer ceramic substrate 51 has a lamellar structure including a base material layer 53, an intercalated layer 55, a constraining layer 54, another intercalated layer 55, and another base material layer 53 in that order from above. Conductor films 56 and 57 patterned as shown in FIG. 19B are formed along the interface between the upper base material layer 53 and the upper intercalated layers 55. Furthermore, a conductive film 58 patterned as shown in FIG. 19C is formed along the constraining layer 54 at the middle and the lower intercalated layer 55.

In order to obtain such a multilayer ceramic substrate 51, the green sheets for forming the base material layers previously described, one of green sheets R1 to R5 for forming the constraining layers, and one of green sheets B1 to B4 for forming the intercalated layers were used as indicated in the column of "Reference No" in Table 7. Furthermore, a conductive paste containing Ag/Pd (weight ratio: 75:25) was used to form conductive films 56 to 58, so as to obtain a mother substrate 50 in a green state.

TABLE 7

| | Constraining layer | | Intercalated layer | |
|---|---|---|---|---|
| Sample No. | Reference No. | α2[ppm/° C.] | Reference No. | α3[ppm/° C.] |
| 11 | R1 | 5.2 | B1 | 4.2 |
| 12 | R1 | 5.2 | B2 | 6.3 |
| 13 | R2 | 7.1 | B1 | 4.2 |
| 14 | R2 | 7.1 | B2 | 6.3 |
| 15 | R3 | 7.6 | B1 | 4.2 |
| 16 | R3 | 7.6 | B4 | 4.9 |
| 17 | R3 | 7.6 | B2 | 6.3 |

TABLE 7-continued

| | Constraining layer | | Intercalated layer | |
|---|---|---|---|---|
| Sample No. | Reference No. | α2[ppm/° C.] | Reference No. | α3[ppm/° C.] |
| 18 | R3 | 7.6 | B3 | 8.5 |
| 19 | R4 | 8.3 | B1 | 4.2 |
| 20 | R4 | 8.3 | B4 | 4.9 |
| 21 | R4 | 8.3 | B2 | 6.3 |
| 22 | R4 | 8.3 | B3 | 8.5 |
| 23 | R5 | 10.3 | B1 | 4.2 |
| 24 | R5 | 10.3 | B4 | 4.9 |
| 25 | R5 | 10.3 | B2 | 6.3 |
| 26 | R5 | 10.3 | B3 | 8.5 |

In Table 7, the reference numbers indicated under the columns "Constraining layer" and "Intercalated layer" correspond to those in "Reference No. of constraining layer" in Table 5 and "Reference No. of intercalated layer" in Table 6. In the column "α2" of "Constraining layer" in Table 7, "Thermal expansion coefficient (α2)" of the constraining layer after baking shown in Table 5 are transcribed. In the column "α3" of "Intercalated layer" in Table 7, "Thermal expansion coefficient (α3)" of the intercalated layer after baking shown in Table 6 is transcribed.

Each sample of the mother substrate 50 obtained as such was baked at a temperature of about 890° C. The X-Y direction shrinkage ratio by the baking was calculated. The ratio was within the range of about 0.4% to about 0.5% in all Samples 11 to 26.

The mother substrate 50 was then diced along the dividing lines 52 to obtain each sample of the multilayer ceramic substrate 51. The water absorption of each multilayer ceramic substrate 51 was evaluated. The water absorption was about 0% for all Samples 11 to 26.

3. Evaluation of Withstand Voltage and Cracks

The withstand voltage and presence of inner cracks of Samples 11 to 26 of the multilayer ceramic substrate 51 were evaluated. The results are shown in Table 8. The opposing area between the conductive film 57 and the conductive film 58 was about 1 mm² and the distance between the conductive film 57 and the conductive film 58 was about 15 μm for all of the samples of the multilayer ceramic substrate 51.

TABLE 8

| Sample No. | α1-α3 [ppm/° C.] | α2-α3 [ppm/° C.] | Withstand voltage [kV] | Inner cracks |
|---|---|---|---|---|
| 11 | 4.1 | 1.0 | 0.9 | Found |
| 12 | 2.0 | −1.1 | >2 | None |
| 13 | 4.1 | 2.9 | 0.9 | Found |
| 14 | 2.0 | 0.8 | 1.2 | None |
| 15 | 4.1 | 3.4 | 0.5 | Found |
| 16 | 3.4 | 2.7 | 0.7 | Found |
| 17 | 2.0 | 1.3 | 1.5 | None |
| 18 | −0.2 | −0.9 | 1.9 | None |
| 19 | 4.1 | 4.1 | 0.5 | Found |
| 20 | 3.4 | 3.4 | 0.5 | Found |
| 21 | 2.0 | 2.0 | 1.3 | None |
| 22 | −0.2 | −0.2 | 1.8 | None |
| 23 | 4.1 | 6.1 | 0.7 | Found |
| 24 | 3.4 | 5.4 | 0.6 | Found |
| 25 | 2.0 | 4.0 | 0.5 | Found |
| 26 | −0.2 | 1.8 | 1.8 | None |

In order to facilitate evaluation, the difference "α1−α3" between the thermal expansion coefficient (α1) of the base material layer 53 and the thermal expansion coefficient (α3) of the intercalated layer 55 and the difference "(α2−α3)" between the thermal expansion coefficient (α2) of the constraining layer 54 and the thermal expansion coefficient (α3) of the intercalated layer 55 are also described in Table 8.

As shown in Table 8, Samples 12, 14, 17, 18, 21, 22, and 26 with "α1-α3" and "α2-α3" of about 2.0 ppm/° C. or less in terms of absolute values exhibited a withstand voltage of at least 1 kV and had no cracks under internal observation of the multilayer ceramic substrate 51. Thus, it is understood from the table that in order to ensure high withstand voltage and crack prevention, it is preferable to adjust both "α1-α3" and "α2-α3" to about 2.0 ppm\° C. or less in terms of absolute value.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
   a base material layer including an aggregate of first particles containing a crystallized glass material and a first ceramic material;
   a constraining layer including an aggregate of second particles containing a second ceramic material that does not sinter at a temperature at which the crystallized glass material is melted;
   an intercalating layer including an aggregate of third particles containing a viscosity-decreasing substance that decreases the viscosity of a melted crystallized glass material; and
   conductive films arranged along a main surface of at least one of the base material layer, the constraining layer and the intercalated layer; wherein
   the intercalating layer is arranged such that one main surface is in contact with the base material layer and the other main surface is in contact with the constraining layer;
   the intercalating layer has a thickness of about 2 µm to about 10 µm;
   at least a portion of the first particles is in a sintered state; and
   the second particles are in an unsintered state but are bonded to each other by a portion of the first particles containing the crystallized glass material and a portion of the third particles that diffuse or flow into the constraining layer.

2. The multilayer ceramic substrate according to claim 1, wherein the viscosity-decreasing substance includes at least one of a low-viscosity glass material and a low-melting-point glass material.

3. The multilayer ceramic substrate according to claim 1, wherein a portion of the crystallized glass material contained in the base material layer diffuses or flows into all portions of the constraining layer, and all of the second particles are bonded to each other by the portion of the crystallized glass material.

4. The multilayer ceramic substrate according to claim 1, wherein the crystallized glass material includes a material vitrified prior to a baking step of sintering at least a portion of the first particles.

5. The multilayer ceramic substrate according to claim 1, wherein the crystallized glass material includes a material vitrified by melting during a baking step of sintering at least a portion of the first particles.

6. The multilayer ceramic substrate according to claim 1, wherein the base material layer includes a plurality of base material layers, and a laminated structure portion is provided between the base material layers adjacent in the lamination direction, the laminated structure portion including the intercalating layer, the constraining layer, and another intercalating layer laminated in that order.

7. The multilayer ceramic substrate according to claim 6, wherein a crystallized glass material content per unit volume in each of the base material layers adjacent in the lamination direction with the intercalating layer, the constraining layer, and the intercalating layer therebetween is substantially the same.

8. The multilayer ceramic substrate according to claim 1, wherein the constraining layer includes a plurality of constraining layers and a laminated structure portion is provided between the constraining layers that are adjacent in the lamination direction, the laminated structure portion including the intercalating layer, the base material layer, and the intercalating layer laminated in that order.

9. The multilayer ceramic substrate according to claim 1, wherein the constraining layer is thinner than the base material layer.

10. The multilayer ceramic substrate according to claim 1, further comprising a cavity having an opening positioned along at least one main surface thereof.

11. The multilayer ceramic substrate according to claim 1, wherein a difference between a thermal expansion coefficient of the base material layer and a thermal expansion coefficient of the intercalating layer is about 2.0 ppm/° C. or less in terms of absolute values, and a difference between a thermal expansion coefficient of the constraining layer and a thermal expansion coefficient of the intercalating layer is about 2.0 ppm/° C. or less in terms of absolute values.

* * * * *